(12) United States Patent
Yamazaki et al.

(10) Patent No.: US 7,622,797 B2
(45) Date of Patent: Nov. 24, 2009

(54) SEMICONDUCTOR DEVICE HAVING A FLEXIBLE PRINTED CIRCUIT

(75) Inventors: Shunpei Yamazaki, Tokyo (JP); Toru Takayama, Kanagawa (JP); Junya Maruyama, Kanagawa (JP); Yuugo Goto, Kanagawa (JP); Yumiko Ohno, Kanagawa (JP); Yasuyuki Arai, Kanagawa (JP); Noriko Shibata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/249,523

(22) Filed: Oct. 10, 2008

(65) Prior Publication Data

US 2009/0091014 A1    Apr. 9, 2009

Related U.S. Application Data

(62) Division of application No. 10/760,723, filed on Jan. 21, 2004, now Pat. No. 7,436,050.

(30) Foreign Application Priority Data

Jan. 22, 2003   (JP)   ............................ 2003-014034

(51) Int. Cl.
G09G 3/36   (2006.01)
(52) U.S. Cl. ............................... 257/678; 257/E23.175
(58) Field of Classification Search .................. 257/347, 257/678, 783, E23.175, E23.177
See application file for complete search history.

(56) References Cited

U.S. PATENT DOCUMENTS 5,206,749 A    4/1993   Zavracky
5,317,236 A    5/1994   Zavracky
5,376,561 A    12/1994  Vu (Continued)

FOREIGN PATENT DOCUMENTS

CN    1256792    6/2000

(Continued)

OTHER PUBLICATIONS

Itsuo Watanabe et al.; "Anisotropic Conductive Films For Flat Panel Displays"; *IDW '96*; pp. 369-372; Nov. 1996.

(Continued)

*Primary Examiner*—Thomas L Dickey
(74) *Attorney, Agent, or Firm*—Fish & Richardson P.C.

(57) ABSTRACT

To provide a thin film device which becomes possible to be formed in the portion which has been considered impossible to be provided with such device by the conventional technique, and to provide a semiconductor device which occupies small space and which has high shock resistance and flexibility, a device formation layer with a thickness of at most 50 μm which was peeled from a substrate by a transfer technique is transferred to another substrate, hence, a thin film device can be formed over various substrates. For instance, a semiconductor device can be formed so as to occupy small space by pasting a thin film device which is transferred to a flexible substrate onto a rear surface of a substrate of a panel, by pasting directly a thin film device onto a rear surface of a substrate of a panel, or by transferring a thin film device to an FPC which is pasted onto a substrate of a panel.

9 Claims, 15 Drawing Sheets

U.S. PATENT DOCUMENTS

| | | | |
|---|---|---|---|
| 5,643,804 A | 7/1997 | Arai |
| 5,737,248 A | 4/1998 | Kawasaki |
| 5,757,456 A | 5/1998 | Yamazaki |
| 5,804,872 A | 9/1998 | Miyano |
| 5,821,138 A | 10/1998 | Yamazaki |
| 5,834,327 A | 11/1998 | Yamazaki |
| 5,861,666 A | 1/1999 | Bellaar |
| 5,877,533 A | 3/1999 | Arai |
| 5,976,953 A | 11/1999 | Zavracky |
| 6,027,958 A | 2/2000 | Vu |
| 6,043,800 A | 3/2000 | Spitzer |
| 6,118,502 A | 9/2000 | Yamazaki et al. |
| 6,127,199 A | 10/2000 | Inoue |
| 6,133,626 A | 10/2000 | Hawke |
| 6,143,582 A | 11/2000 | Vu |
| 6,191,838 B1 | 2/2001 | Muramatsu |
| 6,208,521 B1 | 3/2001 | Nakatsuka |
| 6,242,758 B1 | 6/2001 | Yamazaki et al. |
| 6,258,623 B1 | 7/2001 | Moden |
| 6,265,772 B1 | 7/2001 | Yoshida |
| 6,312,304 B1 | 11/2001 | Duthaler |
| 6,372,608 B1 | 4/2002 | Shimoda |
| 6,376,333 B1 | 4/2002 | Yamazaki |
| 6,388,652 B1 | 5/2002 | Yamazaki |
| 6,410,960 B1 | 6/2002 | Arai |
| 6,423,614 B1 | 7/2002 | Doyle |
| 6,441,474 B2 | 8/2002 | Naitoh |
| 6,503,778 B1 | 1/2003 | Yamauchi |
| 6,506,681 B2 | 1/2003 | Grigg |
| 6,589,811 B2 | 7/2003 | Sayyah |
| 6,590,346 B1 | 7/2003 | Hadley |
| 6,645,830 B2 | 11/2003 | Shimoda |
| 6,677,621 B2 | 1/2004 | Yamazaki |
| RE38,466 E | 3/2004 | Inoue |
| 6,737,300 B2 | 5/2004 | Ding |
| 6,780,677 B2 | 8/2004 | Imasu |
| 6,818,850 B2 | 11/2004 | Bridges |
| 6,830,494 B1 | 12/2004 | Yamazaki |
| 6,844,673 B1 | 1/2005 | Bernkopf |
| 6,846,703 B2 | 1/2005 | Shimoda |
| 6,883,934 B2 | 4/2005 | Kawakami |
| 6,946,361 B2 | 9/2005 | Takayama |
| 6,998,282 B1 | 2/2006 | Yamazaki |
| 7,037,752 B2 | 5/2006 | Kuwabara |
| 7,050,138 B1 | 5/2006 | Yamazaki |
| 7,056,810 B2 | 6/2006 | Yamazaki |
| 7,067,926 B2 | 6/2006 | Yamazaki |
| 7,094,665 B2 | 8/2006 | Shimoda |
| 7,164,151 B2 | 1/2007 | Yamazaki |
| 7,214,555 B2 | 5/2007 | Yamazaki |
| 7,303,942 B2 | 12/2007 | Kuwabara |
| 2001/0040298 A1 | 11/2001 | Baba |
| 2002/0016028 A1 | 2/2002 | Arao |
| 2002/0024096 A1 | 2/2002 | Yamazaki |
| 2002/0030189 A1 | 3/2002 | Ishikawa |
| 2002/0041266 A1 | 4/2002 | Koyama |
| 2002/0055237 A1 | 5/2002 | Sayyah |
| 2002/0100941 A1 | 8/2002 | Yonehara |
| 2002/0131007 A1 | 9/2002 | Yamazaki |
| 2002/0146893 A1 | 10/2002 | Shimoda |
| 2003/0024635 A1 | 2/2003 | Utsunomiya |
| 2003/0025118 A1 | 2/2003 | Yamazaki |
| 2003/0032210 A1 | 2/2003 | Takayama |
| 2003/0034497 A1 | 2/2003 | Yamazaki |
| 2003/0047280 A1 | 3/2003 | Takayama |
| 2003/0047732 A1 | 3/2003 | Yamazaki |
| 2003/0057423 A1 | 3/2003 | Shimoda |
| 2003/0064569 A1 | 4/2003 | Takayama |
| 2003/0082889 A1 | 5/2003 | Maruyama |
| 2003/0122476 A1 | 7/2003 | Wang |
| 2003/0217805 A1 | 11/2003 | Takayama |
| 2003/0231263 A1 | 12/2003 | Kato |
| 2004/0046909 A1 | 3/2004 | Sekiguchi |
| 2004/0087110 A1 | 5/2004 | Takayama |
| 2004/0121516 A1 | 6/2004 | Yamazaki |
| 2004/0124542 A1 | 7/2004 | Kuwabara |
| 2004/0140547 A1 | 7/2004 | Yamazaki |
| 2004/0189883 A1 | 9/2004 | Koyama |
| 2004/0212012 A1 | 10/2004 | Yamazaki |
| 2004/0232413 A1 | 11/2004 | Yamazaki |
| 2004/0238827 A1 | 12/2004 | Takayama |
| 2004/0263712 A1 | 12/2004 | Yamazaki |
| 2005/0001211 A1 | 1/2005 | Yamazaki |
| 2005/0051870 A1 | 3/2005 | Yamazaki |
| 2005/0056842 A1 | 3/2005 | Nishi |
| 2005/0070038 A1 | 3/2005 | Yamazaki |
| 2006/0030122 A1 | 2/2006 | Shimoda |
| 2007/0010067 A1 | 1/2007 | Shimoda |

FOREIGN PATENT DOCUMENTS

| | | |
|---|---|---|
| EP | 0 858 110 A1 | 8/1998 |
| EP | 1 017 100 A1 | 7/2000 |
| EP | 1 229 582 A2 | 8/2002 |
| EP | 1 351 308 | 10/2003 |
| EP | 1 603 163 | 12/2005 |
| EP | 1 655 633 | 5/2006 |
| EP | 1 744 365 | 1/2007 |
| EP | 1 758 169 | 2/2007 |
| JP | 60-178424 | 9/1985 |
| JP | 06-244360 | 9/1994 |
| JP | 08-186156 | 7/1996 |
| JP | 08-262474 | 10/1996 |
| JP | 10-125929 | 5/1998 |
| JP | 10-125930 | 5/1998 |
| JP | 10-125931 | 5/1998 |
| JP | 11-020360 | 1/1999 |
| JP | 11-074533 | 3/1999 |
| JP | 2000-4024 | 1/2000 |
| JP | 2000-061785 | 2/2000 |
| JP | 2000-294723 | 10/2000 |
| JP | 2002-049359 | 2/2002 |
| JP | 2002-189447 | 7/2002 |
| JP | 2002-244576 | 8/2002 |
| JP | 3408154 | 5/2003 |

OTHER PUBLICATIONS

"Mass Production of Organic EL Devices"; *Shimotsuke Newspaper*; Jul. 3, 2003 (full translation).

"Two-way display developed"; Newspaper "*The Japan Times*"; Jul. 3, 2003.

*Exhibition of Active Matrix Type Organic EL Display at "13th Flat Panel Display Manufacturing Technology Expo & Conference*" by ELDis Group; Jul. 2, 2003 (full translation).

Documents distributed in the "*13th Flat Panel Display Manufacturing Technology Expo & Conference*" by ELDis Group; Jul. 3, 2003 (full translation).

Xiang Zhang et al., "Thermal conductivity and diffusivity of free-standing silicon nitride thin films", Rev. Sci. Instrum., 66 (2), Feb. 1995, pp. 1115-1120.

Office Action issued by Patent Office of the People's Republic of China in Application No. 200310123558.0, dated Jun. 8, 2007, 11 total pages, including English translation.

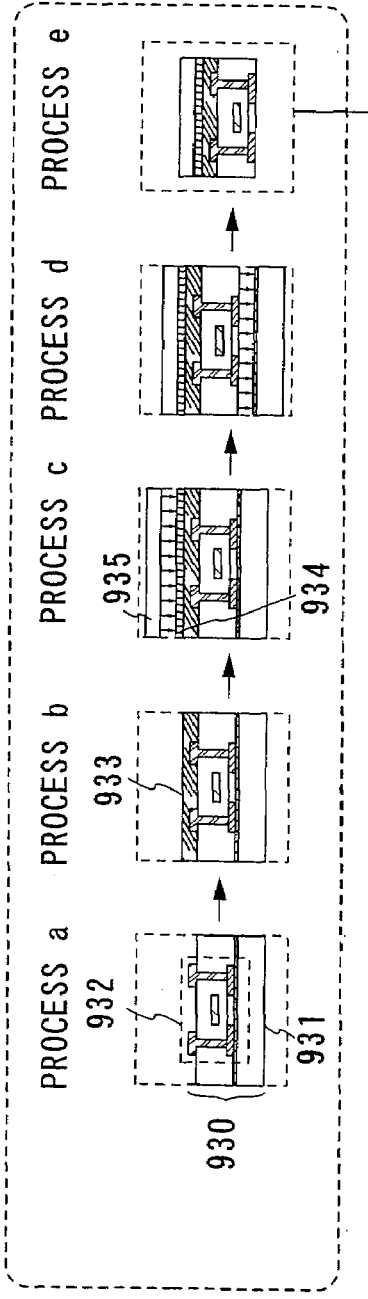
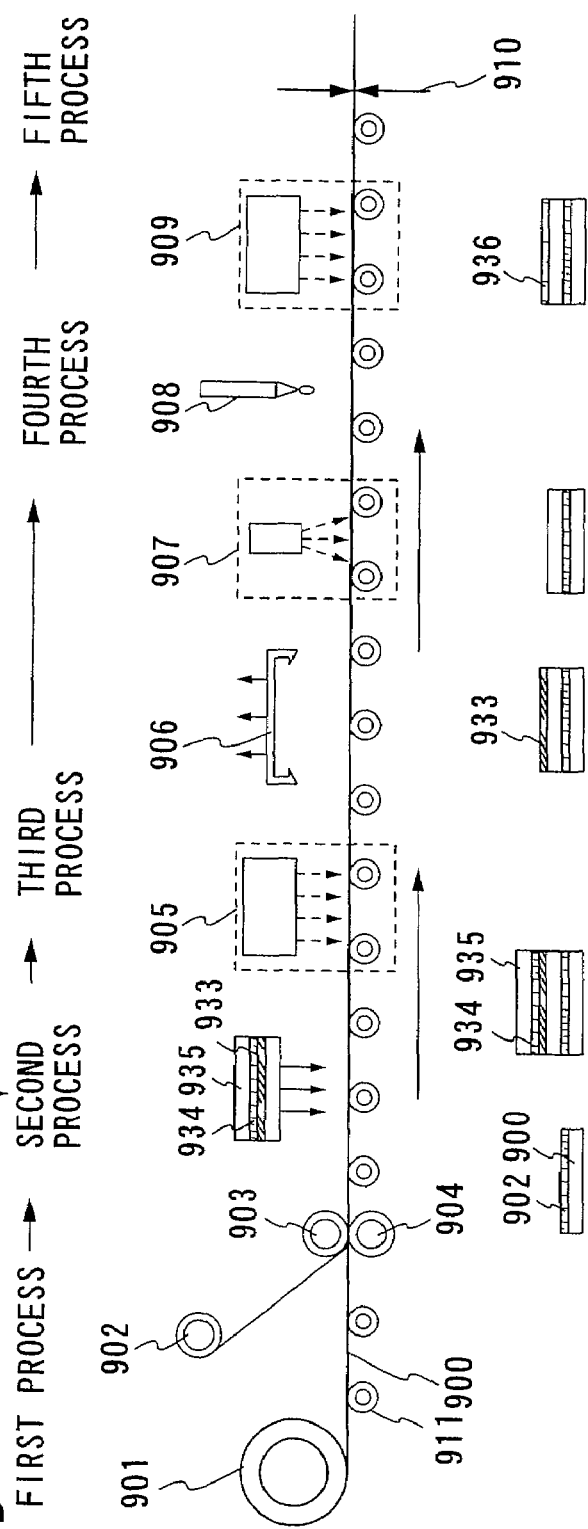

OPERATING FREQUENCY : 5MHz

SEMICONDUCTOR DEVICE HAVING A FLEXIBLE PRINTED CIRCUIT

CROSS-REFERENCE TO RELATED APPLICATIONS

This application is a divisional of U.S. application Ser. No. 10/760,723, filed Jan. 21, 2004, now allowed, which claims the benefit of a foreign priority application filed in Japan as Serial No. 2003-014034 on Jan. 22, 2003, both of which are incorporated by reference.

BACKGROUND OF THE INVENTION

1. Field of the Invention

The present invention relates to a transfer technique of manufacturing a device formation layer including a semiconductor device composed of a plurality of thin film transistors (hereinafter, TFT).

2. Related Art

In recent years, a technique for forming a TFT using a semiconductor thin film (having a thickness of from approximately several to several hundreds nm) formed over a substrate having an insulating surface has been attracted attention. A TFT is utilized widely for an electronic device such as an IC, an electro-optical device, or the like.

As a substrate for forming these TFTs, a glass substrate or a quartz substrate is widely used now, however, these substrates have some drawbacks such as being fragile and heavy. Further, these substrates are unsuitable for mass-production since it is difficult to use a large-sized glass substrate or a large-sized quartz substrate. Therefore it has been attempted that a device composed of TFTs is formed over a substrate having flexibility as typified by a flexible plastic film.

However, the maximum temperature of the process should be lowered since the heat resistance of a plastic film is low, with the result that a TFT having better electric characteristics than those of a TFT formed over a glass substrate cannot be formed. Thus, a semiconductor device, a display device, or a light-emitting device including a TFT which is directly formed over a substrate has not been realized yet.

At the same time, a technique for forming a thin film device over a glass substrate or a quartz substrate, and peeling the thin film device (transferred body) from the substrate, then transferring to a subject such as a plastic substrate, etc. are disclosed. (For example, Unexamined Patent Publication No. 10-125929)

If a semiconductor device, a display device, or a light-emitting device can be manufactured over a substrate having flexibility such as a plastic film, these devices can be utilized for a display of being thin, lightweight, flexible, and curved, so that the range of application can be broaden out.

SUMMARY OF THE INVENTION

It is an object of the present invention is to form a thin film device over various substrates to make it possible for the thin film device to be formed in the portion which has been considered impossible to be provided with such a device by the conventional technique. A further object of the invention is to provide a semiconductor device which occupies small space and which has high shock resistance and flexibility.

According to the invention, a device formation layer with a thickness of at most 50 μm which was peeled from a substrate by a transfer technique is transferred to another substrate, hence, a thin film device can be formed over various substrates. As a substrate which is transferred with a device formation layer, various materials can be selected depending on purposes. Especially, a flexible substrate is better, since a thin film device which has high shock resistance and flexibility can be formed. A TFT included in a device formation layer refers to an amorphous silicon TFT (a-Si TFT) formed by using an amorphous semiconductor layer as an active layer, a polysilicon TFT (p-Si TFT) formed by using a crystalline semiconductor layer as an active layer.

According to the invention, a device formation layer can be directly transferred to a substrate by a transfer technique, but a device formation layer can be once transferred to an auxiliary substrate by a transfer technique to complete a chip, and the chip can be pasted onto a desired portion over the substrate.

A flexible substrate such as a plastic substrate is preferably used for a substrate which is transferred with a thin film device since an advantage of a transfer technique can be taken, that is, a device can be formed over any substrate. In addition, the thin film device can be further integrated by transferring repeatedly a device formation layer with a thickness at most 50 μm which was peeled from another substrate to another device formation layer which was formed in advance.

According to the invention, on the basis of a fact that a device formation layer has a thickness of at most 50 μm and is susceptible to be deteriorated due to heat generated in the device formation layer itself, a thermal conductive material which can radiate heat effectively can be used for a substrate. In case that another device formation layer is transferred to a device formation layer which was transferred in advance, a thermal conductive thin film is preferably formed over the surface of the transferred device formation layer.

As one of constitutions of the invention, a semiconductor device comprises a panel including a pixel portion and a driver circuit, each of which is formed over a substrate; a flexible printed circuit connected to the panel; wherein the flexible printed circuit is provided with an integrated circuit and the integrated circuit is formed by sticking a device formation layer including a plurality of thin film transistors to a flexible substrate.

As one of constitutions of the invention, a semiconductor device comprises a panel including a pixel portion and a driver circuit, each of which is formed over a substrate; a flexible printed circuit connected to the panel; wherein the flexible printed circuit is provided with a integrated circuit and the integrated circuit is formed by sticking a device formation layer including a plurality of thin film transistors on the flexible printed circuit directly.

As one of constitutions of the invention, a semiconductor device comprises a a pixel portion and a driver circuit, each of which is formed over a substrate, wherein the driver circuit is formed by sticking a device formation layer including a plurality of thin film transistors to a flexible substrate.

As one of constitutions of the invention, a semiconductor device comprises a pixel portion and a driver circuit, each of which is formed over a substrate, wherein the driver circuit is formed by sticking a device formation layer including a plurality of thin film transistors to the substrate directly.

Therefore, in the above described constitution, the driver circuit is separately formed, and is transferred to a desired portion over a panel by a transfer technique, instead that the driver circuit is formed over a substrate as in the same way that the pixel portion is formed. Here, the driver circuit can be directly transferred to a substrate of a panel, but the driver circuit can also be pasted over a desired position over a substrate of a panel via solder balls after transferring to an auxiliary substrate which was provided with wrings in advance.

As one of constitutions of the invention, a semiconductor device comprises a panel including a substrate having a front surface and a rear surface, a pixel portion and a driver circuit, each of which is formed over the front surface of the substrate, wherein an integrated circuit is formed by sticking a device formation layer including a plurality of thin film transistors on the rear surface of the substrate.

As one of constitutions of the invention, a semiconductor device comprises a panel including a substrate having a front surface and a rear surface, a pixel portion and a driver circuit, each of which is formed over the front surface of the substrate, wherein an integrated circuit is formed by sticking a device formation layer including a plurality of thin film transistors to the rear surface of the substrate directly.

In the above described constitution, the integrated circuit is directly transferred (stuck) to a rear surface of a panel instead of forming over a flexible substrate by a transfer technique.

The integrated circuit includes at least one selected from the group consisting of a controller, a CPU, or a memory.

In each above described constitution, a semiconductor device according to the present invention includes a CPU (Central Processing Unit), an MPU (Micro Processor Unit), a memory, a microcomputer, an image processor, a display device, and further, a module which is installed with these devices. The display device according to the present invention refers to a liquid crystal display device, a PDP (Plasma Display Panel), an FED (Field Emission Display), an electronic paper, a light-emitting device, or the like. The light-emitting device includes an electroluminescent device, or the like. In addition, the panel may be either an active matrix panel or a passive matrix panel.

According to the invention, a thin film device becomes possible to be formed in the portion which was impossible to be provided with such device by the conventional technique. Therefore a semiconductor device which occupies small space and which has high shock resistance and flexibility can be provided.

BRIEF DESCRIPTION OF THE INVENTION

FIGS. 10A and 10B are explanatory views of a process for mass-production by using a transfer technique;

These and other objects, features and advantages of the present invention will become more apparent upon reading of the following detailed description along with the accompanied drawings.

DETAILED DESCRIPTION OF THE INVENTION

Hereinafter, embodiments of the present invention will be explained in detail.

Embodiment 1

A module (semiconductor module), which is provided with an integrated circuit formed by a transfer technique over an FPC (Flexible Printed Circuit) for connecting electrically a panel 100 to outside will be explained in this embodiment with reference to FIGS. 1A to 1C.

Figure 1A:
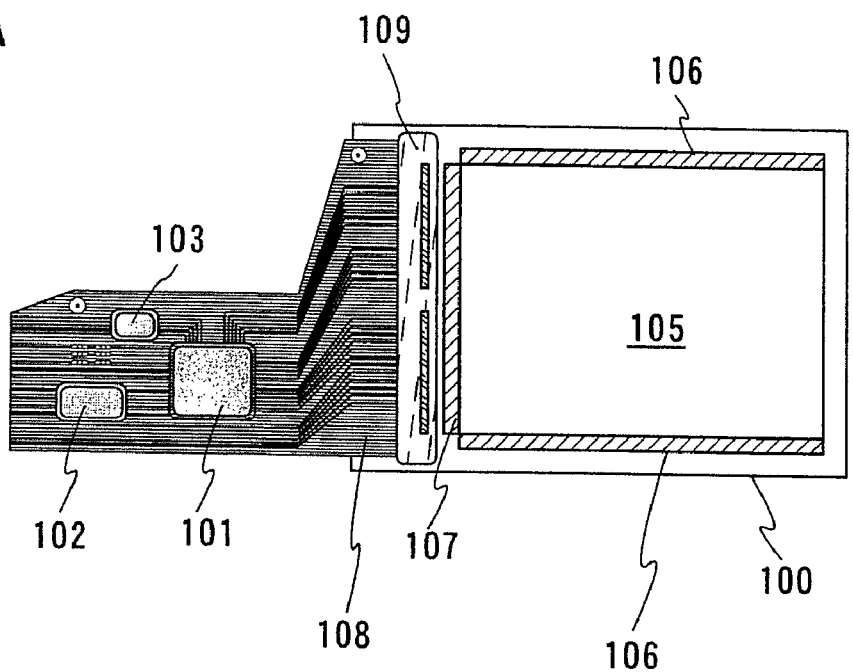
FIGS. 1A to 1C are explanatory views of a constitution according to the present invention explained in embodiment 1.

FIG. 1A is a top view of a semiconductor module. FIG. 1B is a cross-sectional view of the semiconductor module. The panel 100 is provided with a pixel portion 105 and a driver circuit (a signal line driver circuit 107, a scanning line driver circuit 106). An FPC (Flexible Printed Circuit) 108 for connecting electrically the driver circuit to an external power source or the like provided at outside (not shown) is pasted over the panel 100 with an adhesive 109.

Further, an integrated circuit (a controller 101, CPU (Central Processing Unit) 102, a memory 103) is formed over the FPC 108 by the transfer technique.

In addition, the integrated circuit (a controller 101, CPU (Central Processing Unit) 102, a memory 103) can be formed to have a thickness of at most 50 μm by the transfer technique. Therefore, the integrated circuit becomes possible to be formed over a flexible film such as the FPC 108. Even if a physical force is applied to the FPC 108 and the FPC 108 bends due to the force as shown in FIG. 1B, the integrated circuit formed by the transfer technique can be used for the FPC without undermining its function since the integrated circuit can meet such deformation.

Figure 1B:
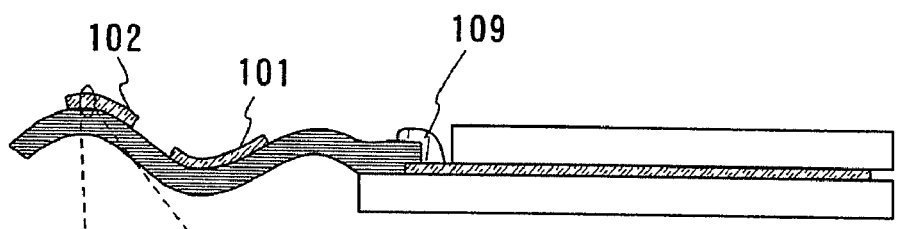
Figure 1C:
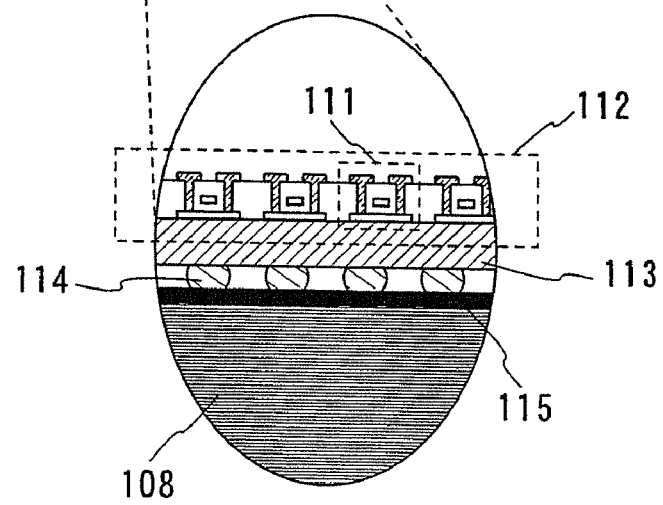

FIG. 1C is an enlarged view of the CPU 102 which is a part of the integrated circuit formed over the FPC 108 shown in FIG. 1B.

A device formation layer 112 composed of a plurality of TFTs 111 is transferred to a flexible auxiliary substrate 113 by a transfer technique (double transfer, in this instance), and is electrically connected to a wiring 115 which is formed over the FPC 108 via bumps 114. Here, the case that the device formation layer 112 is electrically connected to the wiring 115 which is formed over the FPC 108 by the bumps 114 after the device formation layer 112 is transferred to the auxiliary substrate 113 is exemplified. However, the invention is not limited to the case, that is, the device formation layer 112 can be electrically and directly connected to the wiring 115 without using the auxiliary substrate 113 and the bumps 114. In addition, a way of the double transfer will be explained in detail in embodiment 5.

Figure 2A:
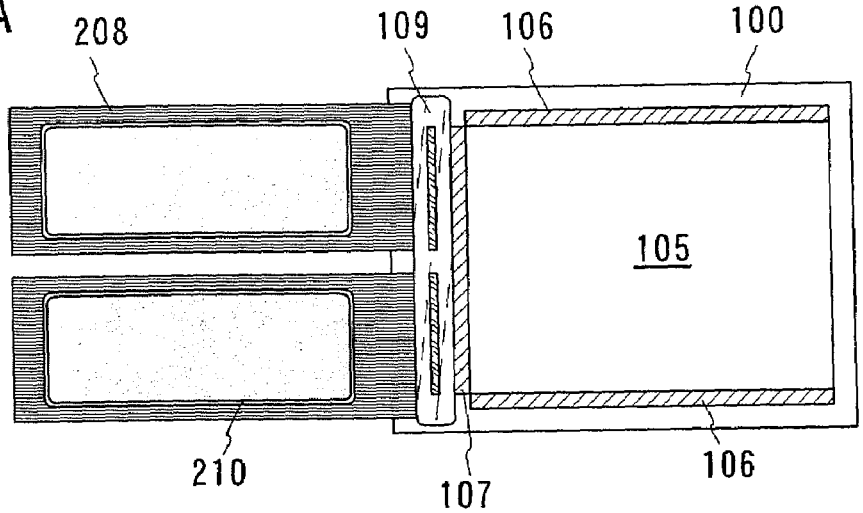
FIGS. 2A to 2C are explanatory views of a constitution according to the present invention explained in embodiment 1.
Figure 2B:
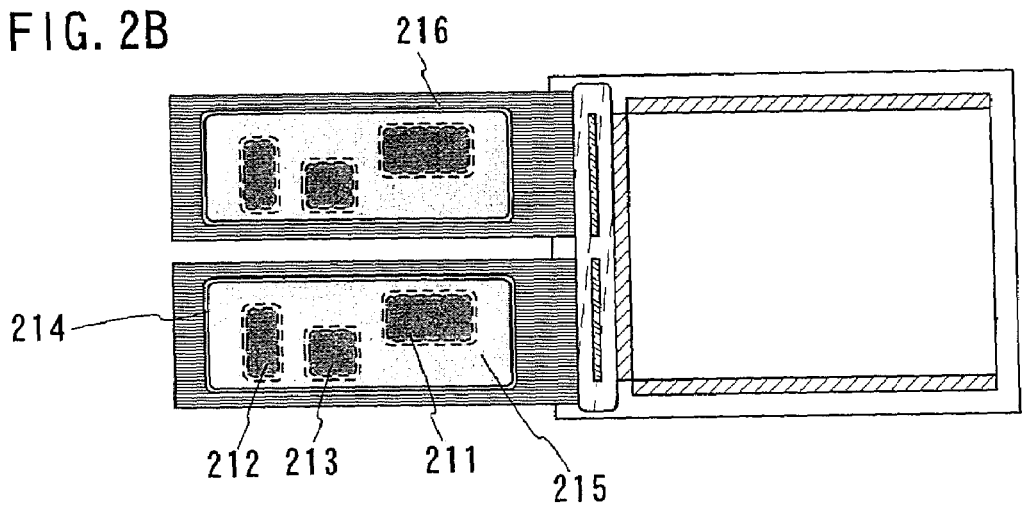

As another way of forming an integrated circuit over an FPC, an integrated circuit which is transferred to an FPC 208 can be grown in size as shown in FIGS. 2A and 2B.

The integrated circuit in this case may be formed in such a way that an integrated circuit 210 formed by transferring respectively a controller, a CPU, a memory, and the like, is formed over a large flexible auxiliary substrate, and the substrate with the integrated circuit 210 is pasted onto the FPC 208 as shown in FIG. 2A. Besides, an integrated circuit 205 composed of a controller 211, a CPU 212, a memory 213, and the like is transferred to an auxiliary substrate 214, and the substrate 214 transferred with the integrated circuit 205 may be pasted onto an FPC 216.

A large integrated circuit which is transferred to an FPC as described above makes it possible that a margin for transferring can be set wide so that alignment in transferring (pasting) can be carried out easily.

Figure 2C:
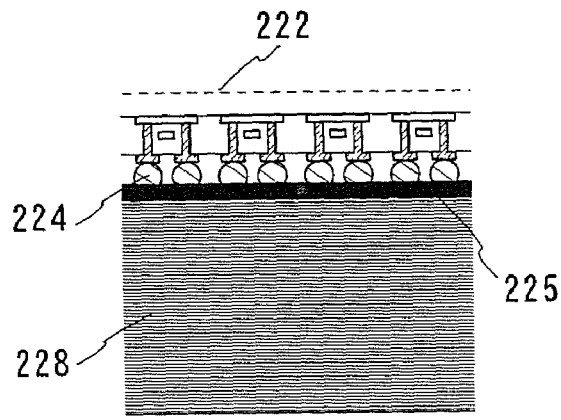

As a transfer technique according to the present invention, single transfer, that is, a device formation layer 222 formed over a substrate is transferred to the region where the device formation layer 222 can electrically connected to a wiring 225, which is formed over a substrate (here, an FPC 228), via bumps 224, and the substrate is separated, can be carried out. In this case, the form shown in FIG. 2C is obtained.

Embodiment 2

Figure 3A:
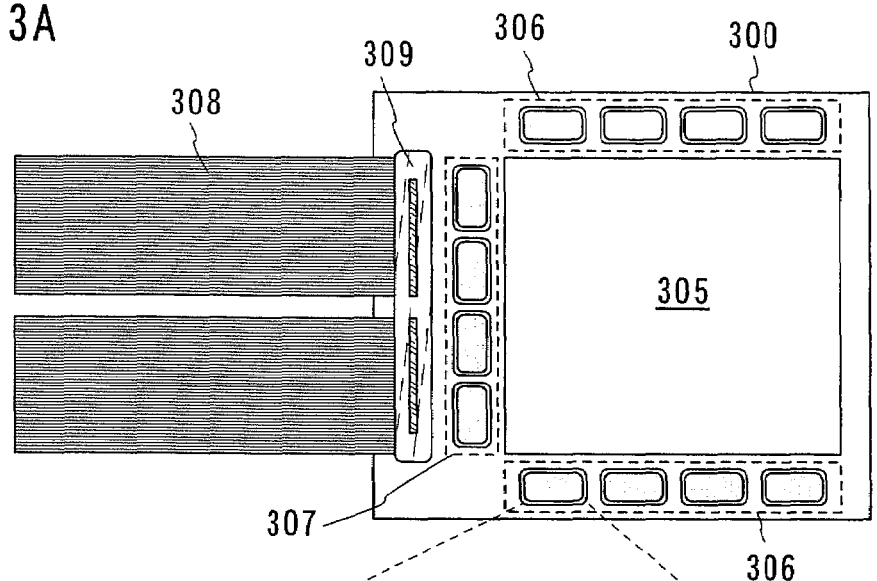
FIGS. 3A to 3C are explanatory views of a constitution according to the present invention explained in embodiment 2.
Figure 3B:
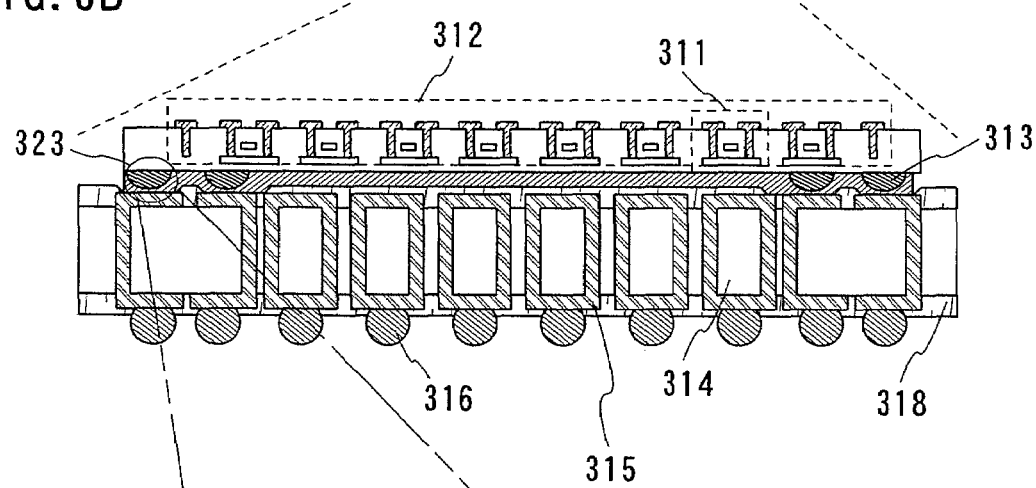
Figure 3C:
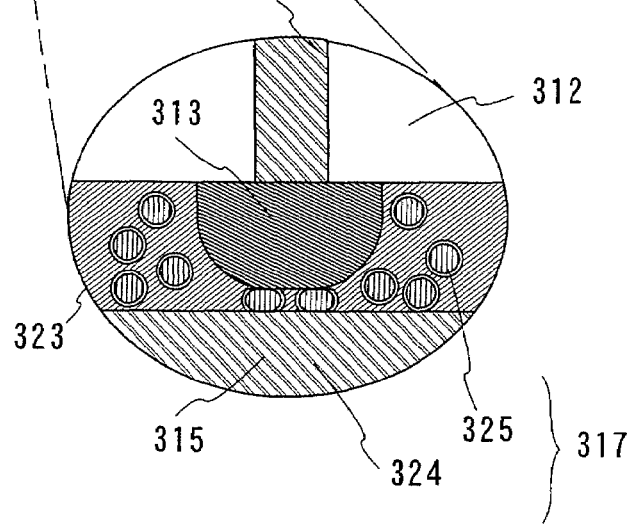

A module (semiconductor module) in which a driver circuit over a panel is formed by a transfer technique is explained in this embodiment with reference to FIGS. 3A to 3C.

FIG. 3A is a top view of a semiconductor module. A panel 300 is provided with a pixel portion 305 and a driver circuit (a signal line driver circuit 307, a scanning line driver circuit 306). An FPC (Flexible Printed Circuit) 308 for connecting electrically the driver circuit to an external power source or the like provide at outside (not shown) is pasted onto the panel 300 with an adhesive 309.

In this embodiment, the driver circuit (the signal line driver circuit 307, the scanning line driver circuit 306) is formed by a transfer technique. Consequently, in case of using a flexible substrate to manufacture a panel, the driver circuit can be formed easily over the flexible substrate.

FIG. 3B is an enlarged view of the driver circuit (the signal line driver circuit 307, the scanning line driver circuit 306) formed over the panel. Hereinafter, a structure of a chip in which a device formation layer 312 is transferred to an auxiliary substrate 314 will be explained in detail.

As shown in FIG. 3B, the device formation layer 312 composed of a plurality of TFTs 311 is formed by a transfer technique over the auxiliary substrate 314 which is flexible. In addition, the auxiliary substrate 314 is provided with a wiring 315 in advance. The device formation layer 312 which is transferred is electrically connected to the wiring 315 via bumps 313. Further, the device substrate 312 is pasted onto a panel 300 via solder balls 316 connected electrically to the wiring 315, consequently, wirings (not shown) over the panel 300 can be electrically connected to the driver circuit.

FIG. 3C is an enlarged view of reference numeral 323 in FIG. 3B. A plurality of wirings included in the device formation layer 312 are leaded out by a leading out wiring 321 as shown in FIG. 3C. Bumps 313 formed in contact with the leading out wiring 321 are electrically connected to the wiring 315 over the auxiliary wiring 314 via an anisotropic conductive adhesive layer 317.

As a material for the anisotropic conductive adhesive layer 317, anisotropic conductive particles 325 formed by covering metal particles such as Ag, Au, Al, or the like with insulating films, and an adhesive 324 selected from various curing adhesives, for example, a photo-curing adhesive such as a reaction-curing adhesive, a thermosetting adhesive, or a UV cure adhesive, or an anaerobic adhesive can be used. In the anisotropic conductive adhesive layer 317, the bumps 313 and the wiring 315 over the auxiliary substrate 314 are electrically connected each other via the anisotropic conductive particles 325.

Therefore a driver circuit formed by pasting a chip, which is formed by transferring a driver circuit to the auxiliary substrate 314 which is flexible, onto the panel 300 via the solder balls 316 can be used without undermining its function even if a shape of the substrate bends due to a physical force since the driver circuit has flexibility to meet such deformation.

Further, even if deterioration is discovered in one chip, yields can be improved by exchanging the deteriorated chip for a normal chip.

In this embodiment, the case that each the signal line driver circuit 307 and the scanning line driver circuit 306 is formed by pasting a plurality of semiconductor chips onto a panel is explained, but not exclusively, the signal line driver circuit 307 and the scanning line driver circuit 306 can be formed by pasting one chip onto a panel respectively.

Embodiment 3

In this embodiment, the case that an integrated circuits (a controller 401, a CPU 402, a memory 403) formed over a flexible substrate by a transfer technique is wholly pasted onto a rear surface of a panel will be explained with reference to FIG. 4.

Figure 4A:
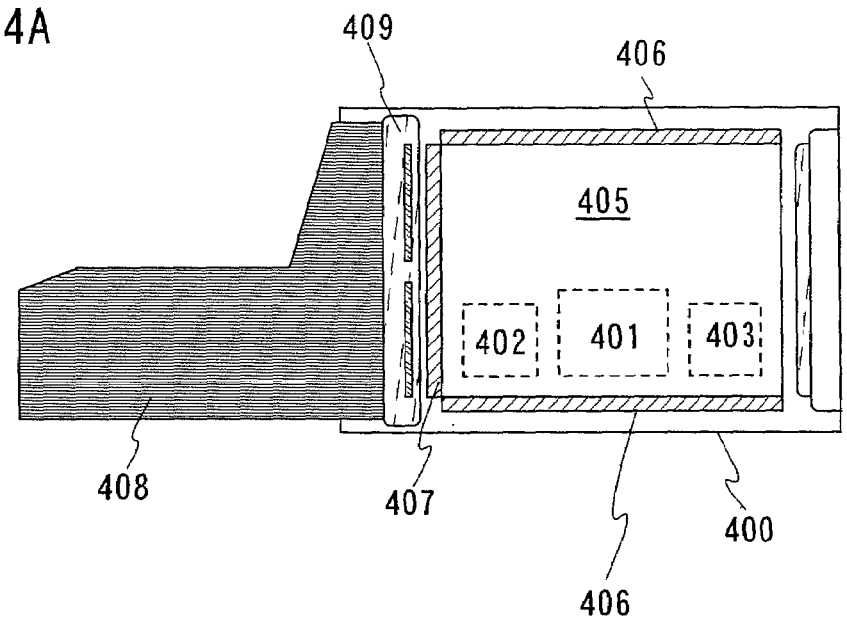
FIGS. 4A to 4C are explanatory views of a constitution according to the present invention explained in embodiment 3.
Figure 4B:
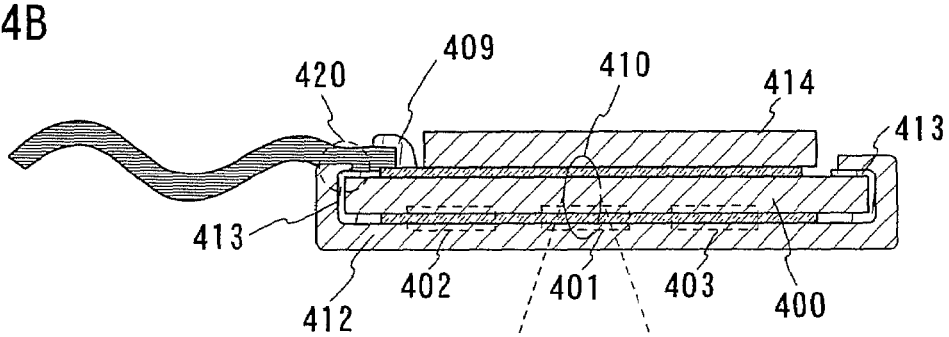

FIG. 4A is a top view of a semiconductor module. FIG. 4B is a cross-sectional view of the semiconductor module. A panel 400 is provided with a pixel portion 405 and a driver circuit (a signal line driver circuit 407, a scanning line driver circuit 406). An FPC (Flexible Printed Circuit) 408 for connecting electrically the driver circuit to an external power source or the like provided at outside (not shown) is pasted onto the panel 400 with an adhesive 409.

A rear surface of the panel 400 is pasted with a flexible substrate 412 provided with an integrated circuit (a controller 401, a CPU 402, a memory 403) with an adhesive 413 by the transfer technique (double transfer) as shown in FIG. 4B.

The integrated circuit (a controller 401, a CPU 402, a memory 403) is formed over a flexible substrate 412 by the transfer technique. The integrated circuit can be easily pasted by its flexibility over a substrate 411 for forming a panel.

Figure 4C:
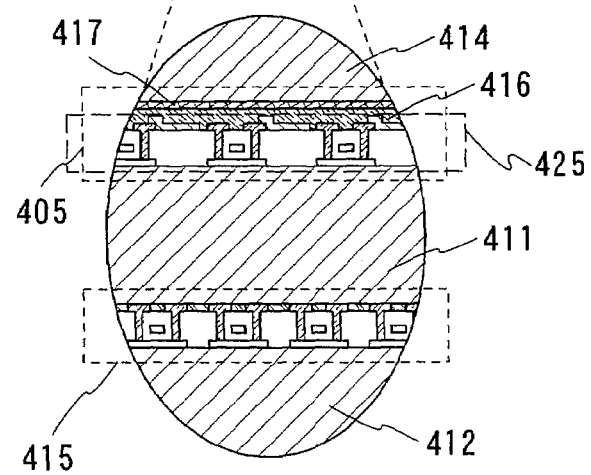

FIG. 4C is an enlarged view of a pixel portion 405 and a CPU 402 shown in FIG. 4B.

Therefore the panel 400 is transferred with TFT and a device formation substrate 425 which composed pixels and includes devices, and is provided with the pixel portion 405. The same surface as the panel 400 is transferred with a device formation layer which composes a driver circuit, and is provided with a driver circuit (a signal line driver circuit 407, a scanning line driver circuit 406) (not shown).

Further, the pixel portion 405 is provided with a liquid crystal device. Hence, a substrate 414 which included a counter electrode 417 is provided via liquid crystal 416 over the device formation layer 425 for forming a pixel portion 405.

A rear surface, which is not provided with the pixel portion 405, of the panel 400 is provided with the integrated circuit 415 such as the CPU 402 which is formed over the flexible substrate 412 by a transfer technique (double transfer). A surface of the integrated circuit 415 where wirings are exposed is pasted onto the panel 400 with the adhesive 413. As a material for the adhesive 413, various curing adhesives, for example, a photo-curing adhesive such as a reaction-curing adhesive, a thermal-curing adhesive, or a UV cure adhesive, or an anaerobic adhesive can be used.

In this embodiment, a wiring of the integrated circuit 415 is electrically connected to the FPC 408 at a region denoted by reference numeral 420 shown in FIG. 4B.

According to this embodiment, a semiconductor device can be downsized to occupy as small space as possible since an integrated circuit can be formed over a rear surface of a panel and is unnecessary to be provided at outside.

Embodiment 4

In this embodiment, a module (semiconductor module) will be explained with reference to FIGS. 5A to 5C, in which an integrated circuit is formed over a rear surface of a substrate, which will be provided with a pixel portion and a driver circuit, by way of the following manner, that is, a chip, which is formed by transferring an integrated circuit to an auxiliary substrate, is pasted onto a rear surface of a substrate transferred with a device formation layer which composes pixels. The module is different from that explained in embodiment 3.

Figure 5A:
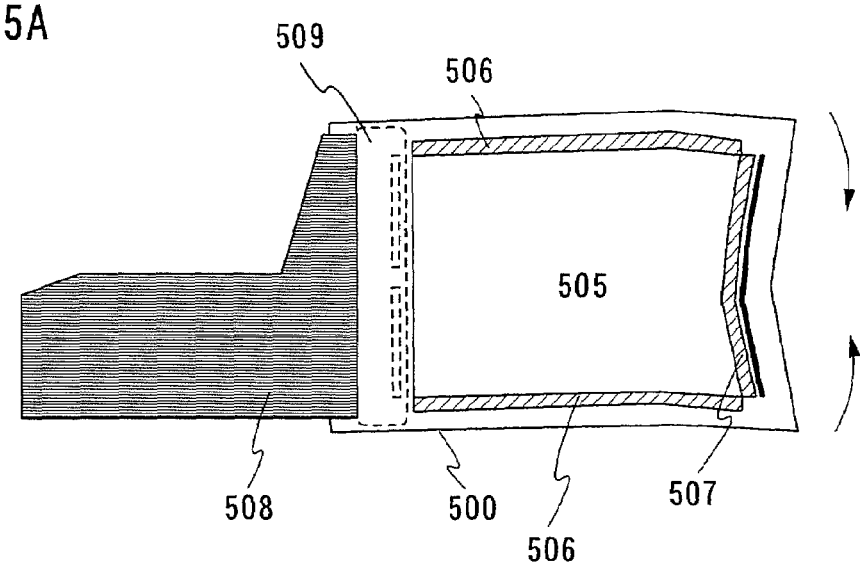
FIGS. 5A to 5C are explanatory views of a constitution according to the present invention explained in embodiment 4.

FIG. 5A is a top view of a semiconductor module. FIG. 5B is a top view of a rear surface of the semiconductor module. FIG. 5C is a cross-sectional view of the semiconductor module. In this embodiment, a panel is preferably formed by using a flexible substrate that can be transformed into another shape since an advantage of transfer that enable a device formation layer to be easily formed over also a flexible substrate can be taken.

A panel 500 is provided with a pixel portion 505 and a driver circuit (a signal line driver circuit 507, a scanning line driver circuit 506). An FPC (Flexible Printed Circuit) 508 for connecting electrically the driver circuit to an external power source or the like provided at outside (not shown) is pasted onto the panel 500 with an adhesive 509.

Figure 5B:
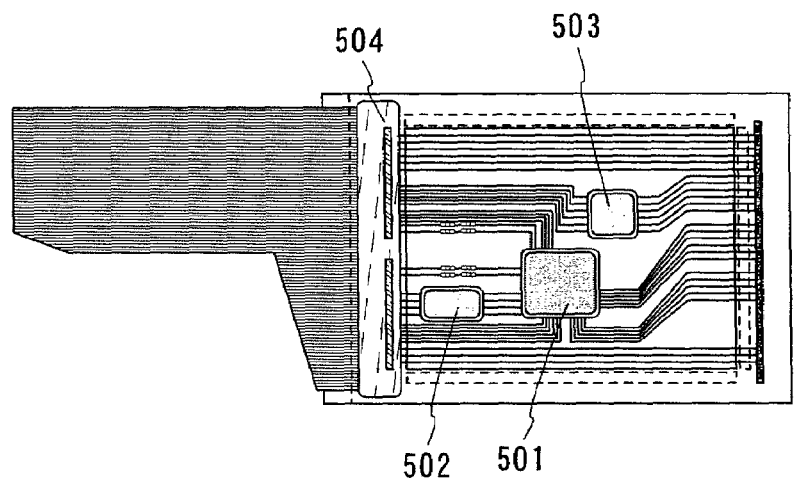

A rear surface of the panel 500 is pasted with a chip provided with an integrated circuit 512 (a controller 501, a CPU 502, a memory 503) with an adhesive by a transfer technique (double transfer) as shown in FIG. 5B.

The integrated circuit (a controller 501, a CPU 502, a memory 503) is transferred to a flexible auxiliary substrate, and pasted onto the panel 500. Even if a physical force is applied to the panel 500 and the panel 500 bends due to the force as shown in FIG. 5B, the integrated circuit formed by a transfer technique can be used for the panel without undermining its function since the integrated circuit has flexibility to meet such deformation.

Figure 5C:
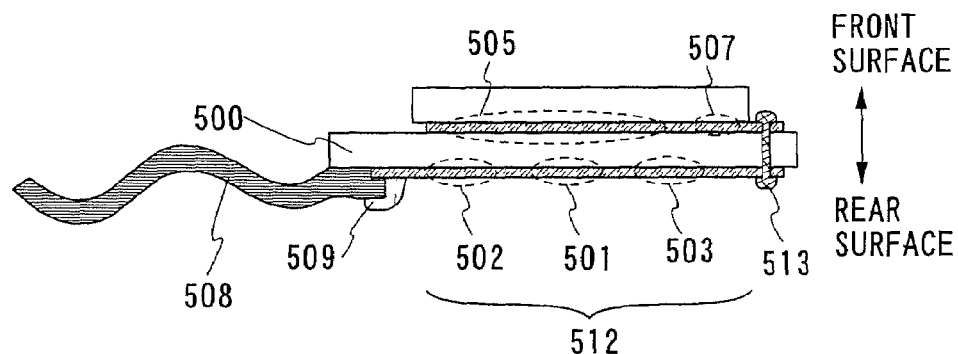

As shown in FIG. 5C, a pixel portion and a driver circuit formed over a surface of a panel are electrically connected to the integrated circuit (a controller 501, a CPU 502, a memory 503) by an auxiliary wiring 513. As a material for forming the auxiliary wiring 512, Au, Cu, Al, Al—Si, Au alloys, or the like can be used.

In this embodiment, the FPC 508 is pasted onto a rear surface of the panel with the adhesive 509. The FPC 508 is electrically connected to the integrated circuit 512 (a controller 501, a CPU 502, a memory 503) which is pasted onto a panel, and to a pixel portion 505 and the driver circuit (a signal line driver circuit 507, a scanning line driver circuit 506) via a wiring (not shown) formed over the rear surface of the panel and via the auxiliary wiring 513.

According to this embodiment, a semiconductor device can be downsized to occupy as small space as possible since an integrated circuit can be formed over a rear surface of a panel and is unnecessary to be provided at outside.

Embodiment 5

In this embodiment, a transfer technique (double transfer) will be explained in detail with reference to FIGS. 6A to 6C and 7A to 7C.

Figure 6A:
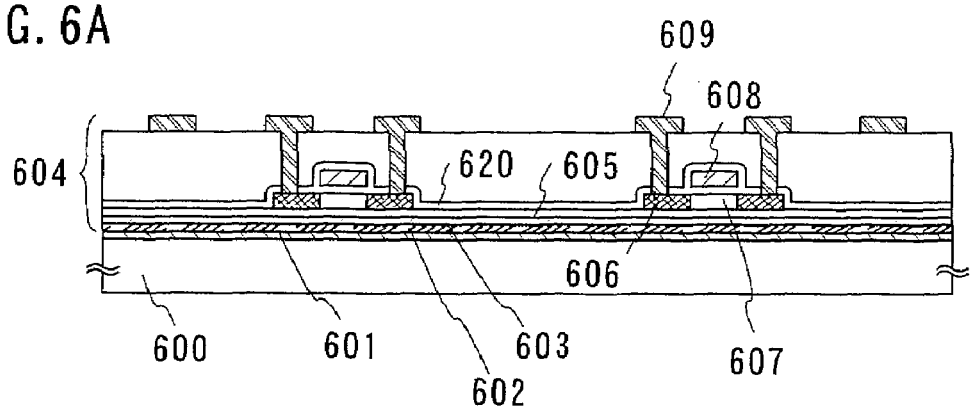
FIGS. 6A to 6C are explanatory views of a transfer technique.

FIG. 6A is a view of showing a state that a metal layer 601, a metal oxide layer 602, and an oxide layer 603 are sequentially stacked over a first substrate 601, and a device formation layer 604, which includes a plurality of TFTs and wirings, is formed thereon.

As the first substrate 600, a glass substrate, a quartz substrate, a plastic substrate, a ceramic substrate, a silicon substrate, a metal substrate, or a stainless substrate, or the like, can be used. AN 100, which is a glass substrate, is used in this embodiment.

As materials for the metal layer 601 formed over the first substrate 600, an element selected from the group consisting of W, Ti, Ta, Mo, Nd, Ni, Co, Zr, Zn, Ru, Rh, Pd, Os, Ir, and Pt; a single layer formed of an alloy material or a compound material, each of which contains these elements as their main components; a lamination layer of the single layers; or nitrides, for example, a single layer or a lamination layer formed by titanium nitride, tungsten nitride, tantalum nitride, or molybdenum nitride. The metal layer 601 is formed to have a thickness of from 10 to 200 nm, preferably, from 50 to 75 nm.

In case of forming a metal layer 601 by sputtering, the thickness of a vicinity of a periphery portion of the metal layer 601 is tend to be inhomogeneous since the first substrate 600 is fixed. Therefore, only the periphery portion of the metal layer 601 is preferably removed by dry etching. In this regard, an insulating film formed by an oxynitride silicon film can be formed to have a thickness of approximately 100 nm between the substrate 600 and the metal layer 601 in order to prevent the first substrate 600 from being etched.

The metal oxide layer 602 and the oxide layer 603 are formed over the metal layer 301. In this embodiment, the case that the oxide layer 603 is formed, and the metal layer 601 is oxidized in later processes, and then, the metal oxide layer 602 is formed will be described.

Therefore a layer formed by tungsten is formed to have a thickness of from 10 to 200 nm, preferably, from 50 to 75 nm as the metal layer 601. Further, the oxide layer 603, a silicon oxide layer in this instance, is stacked thereon to have a thickness of from 150 to 200 nm without exposing to the atmosphere. The thickness of the oxide layer 603 is preferably more than twice as thick as that of the metal layer 601. For example, a silicon oxide film is preferably formed to have a thickness of from 150 to 200 nm by sputtering using silicon oxide targets.

A device formation layer 604 formed over the oxide layer 603 is provided with a semiconductor device, a display device, or a light-emitting device, each of which includes a device formed by combining appropriately TFTs (a p-channel TFT or an n-channel TFT). The TFT described here is composed of an impurity region 606, a channel formation region 607, each of which is formed in a part of a semiconductor film over a base film 605, a gate insulating film 620, and a gate electrode 608. Electrical connection of the TFT is realized by a wiring 609. Further, an electrode pad 610 is formed, which makes it possible to connect the TFT to the outside.

In fabricating the device formation layer 604, after forming a material film (a semiconductor film or a metal film) containing at least hydrogen, heat treatment is carried out to diffuse the hydrogen contained in the material film. The heat treatment may be carried out at least 420° C. The heat treatment may be carried out separately from the process for fabricating the device formation layer 604, or doubled as the process for fabricating the device formation layer 604 for simplification of the number of processes. For example, when an amorphous silicon film containing hydrogen is deposited by sputtering as a material film containing hydrogen and heat treated at least 500° C., a polysilicon film is formed simultaneously with diffusing hydrogen which is contained in the amorphous silicon film by the heat treatment.

According to the heat treatment, the metal oxide layer 602 having a crystalline structure is formed between the metal layer 601 and the oxide layer 603. An amorphous metal oxide layer (tungsten oxide layer) with a thickness of from 2 to 5 nm, which is formed between the metal layer 601 and the silicon oxide layer 602 in forming the metal layer 601 and the oxide layer 603, is included in the metal oxide layer 602 since the amorphous metal oxide layer (tungsten oxide layer) is formed to have a crystalline structure by this heat treatment.

In this embodiment, the case that the metal oxide layer 602 is formed in the process for manufacturing a part of a device formation layer is explained, but not exclusively, the metal oxide layer 602 may be formed after forming the oxide layer 601, and the oxide layer 603 may be formed thereafter.

Figure 6B:
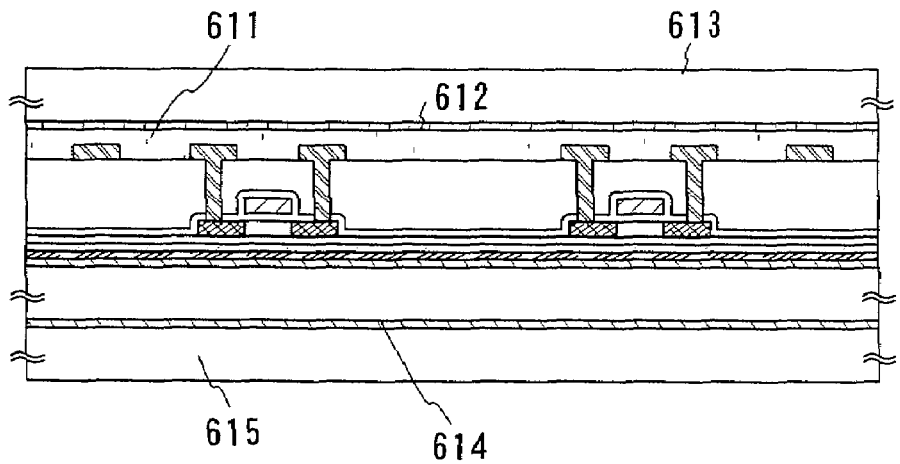

Next, as shown in FIG. 6B, an organic resin layer 611 is formed over the device formation layer 604. As a material for fabricating the organic resin layer 611, an organic material that is soluble in water or alcohol is used. The organic resin layer 611 is formed by coating the organic material over the whole surface and curing. The organic material may be composed of, for example, epoxy series, acrylate series, silicon series, or the like. Specifically, water-soluble resin (TOAGOSEI Co., Ltd.: VL-WSHL10) is spin-coated to have a thickness of 30 μm, and exposed for two minutes to be partially cured, then, exposed its rear surface with UV rays for 2.5 minutes, and then, exposed its obverse surface for 10 minutes to be fully cured. Consequently, the organic resin layer 611 is formed.

The adhesiveness of the metal oxide layer 602 is partly weakened in order to make it easier to be peeled. The partly weakening process of adhesiveness is carried out by radiating laser light to the region, which is to be peeled, of the metal layer 601 or the oxide layer 603 along with the periphery thereof, or pressuring locally from outside on the region, which is to be peeled, along with the periphery thereof to damage a part of the internal or interfacial of the oxide layer 603. Specifically, a hard needle such as a diamond pen presses perpendicular to a region to be peeled and moves along with the periphery of the region with applying loading. Preferably, a scriber device can be used to move with applying loading on the region with press force ranging from 0.1 to 2 mm. It is important to carry out some processes for easy peeling, that is, to prepare for peeling process. Such preparatory process for weakening selectively (partly) the adhesiveness will prevent poor peeling and improve a process yield.

By forming a first adhesive 612, a second substrate 613 can be bonded to the organic resin layer 611 via the first adhesive layer 612. As a material for forming the first adhesive layer 612, a known material that its adhesive can weaken by a predefined treatment can be used in a later process, however, the case that a photosensitive two-side tape that its adhesiveness weaken due to light irradiation is used in later a process will be described in this embodiment.

The second adhesive layer 614 is also formed over an exposed surface of the first substrate 600. The third substrate 615 is bonded thereto via the second adhesive layer 614. As a material for forming the second adhesive layer 614, a two-sided tape is used along with the first adhesive layer 612. The third substrate 615 prevents the first substrate 600 from damaging in separating in a later process. As the second substrate 613 and the third substrate 615, the substrate that has higher rigidity than that of the first substrate 600, for example, a quartz substrate or a semiconductor substrate is preferably to be used.

Figure 6C:
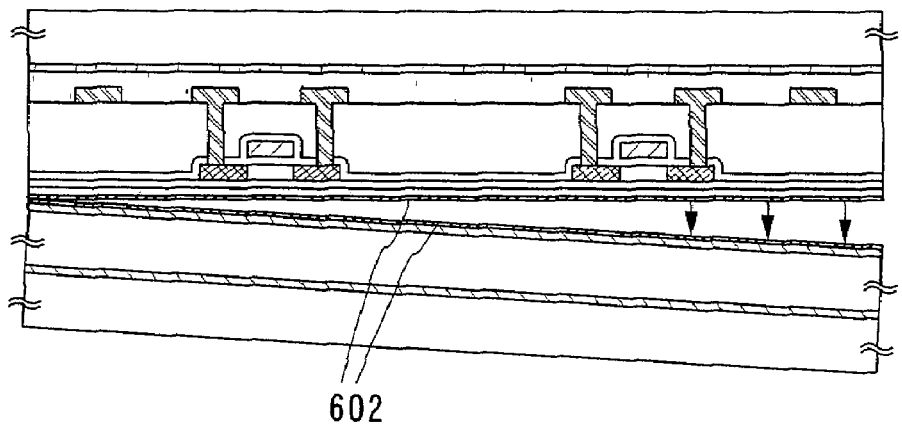

The first substrate 600 provided with the metal film 601 is peeled from the side of the region which is partly weakened its adhesiveness by a physical means. The metal layer 601 and the substrate 600 can be separated by splitting the metal oxide layer 602 with comparatively small force (for example, man's hand, air pressure of gas sprayed from a nozzle, ultrasonic waves, or the like). Specifically, the first substrate 600 can be separated by splitting a tungsten oxide film, an interface between a tungsten oxide film and a silicon oxide film, or an interface between a tungsten oxide film and a tungsten film. Thus, the device formation layer 604 formed over the oxide layer 603 can be peeled from the first substrate 600. FIG. 6C shows a state in peeling.

A portion of the metal oxide layer 602 is remained over a surface exposed by peeling. The remained metal oxide layer 602 may hinder an adhesive force between the exposed surface and the substrate or the like, so that the remained metal oxide layer 602 is preferably removed. To remove the remained metal oxide layer 602, aqueous alkali such as aqueous ammonia or aqueous acids can be used. In addition, the following process may be carried out at the temperature (at most 430° C.) which makes it easier for a part of the metal oxide layer 602 to be peeled.

Figure 7A:
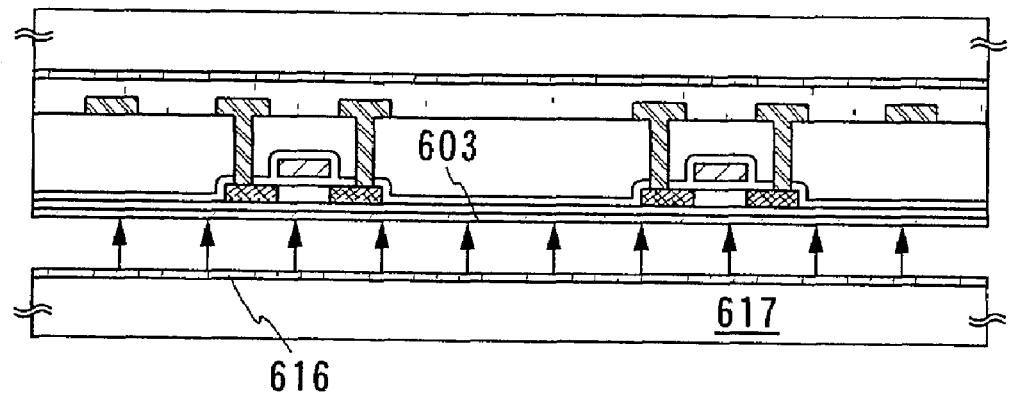
FIGS. 7A to 7C are explanatory views of a transfer technique.

Next, a third adhesive layer 616 is formed, and a fourth substrate 617 is bonded to the oxide layer 603 (and a device formation layer 604) via the third adhesive layer 616 (FIG. 7A). Note that it is important that the adhesiveness of the second substrate 613 and the organic resin layer 611 bonded by the first adhesive layer 612 is greater than that of the oxide layer 603 (and the device formation layer 604) and the fourth substrate 617 bonded by the third adhesive layer 616.

As a fourth substrate (a thermal conductive substrate) 617, a glass substrate, a quartz substrate, a ceramic substrate, a flexible substrate (a plastic substrate), a silicon substrate, a metal substrate, or a stainless substrate, or the like, can be used. It is preferably to use a substrate having flexibility. It is necessary that wirings for connecting electrically the fourth substrate 617 to a device formation layer which is stacked afterward is formed in the fourth substrate 617. As a means of forming the wirings, a known means that is used in a field of LSI for forming wirings in the substrate (also referred to as a die) to be pasted with a chip can be used, so that the explanation thereof will be omitted.

A flattening film may be formed to prevent devices in the device formation layer 604 from being destroyed and being damaged its interconnection due to irregularities of the surface of the fourth substrate 617 considering that the device formation layer according to the present invention is such a thin film with a thickness of at most 50 μm.

As a material for the third adhesive 616, various curing adhesives, for example, a photo-curing adhesive such as a reaction-curing adhesive, a thermal-curing adhesive, or a UV cure adhesive, or an anaerobic adhesive can be used. More preferably, the curing adhesives is given high thermal conductivity by means of mixing powder comprising silver, nickel, aluminum, or aluminum nitride, or filler.

Figure 7B:
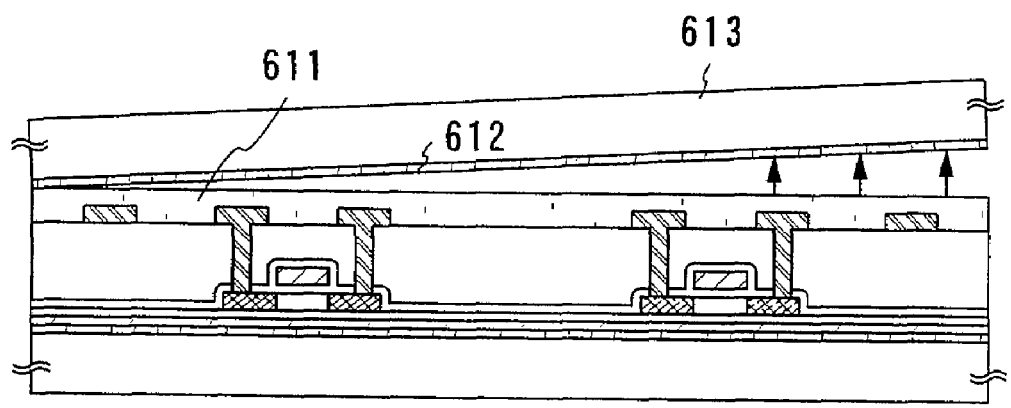

Then, UV light is radiated to the side of the second adhesive layer 613 in order to weak the adhesiveness of the two-sided tape used for the first adhesive 612, and then, the second substrate 613 is separated form the device formation layer 604 (FIG. 7B). Further, the first adhesive layer 612 and the organic resin layer 611 are melted and removed by water washing the exposed surface (FIG. 7C).

Figure 7C:
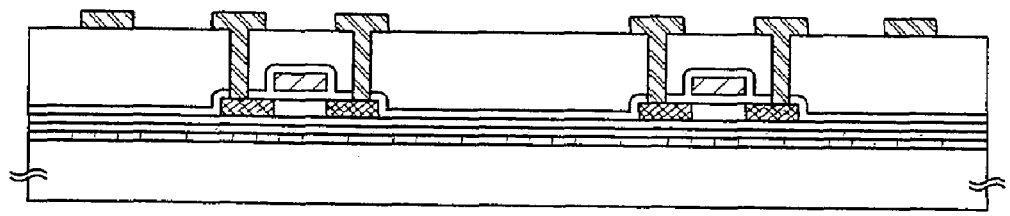

In case that the device formation layer 604 serves as a pixel portion and a driver circuit, the device formation layer 604 is formed to have the structure as shown in FIG. 7C. (However, in case that the device formation layer 604 serves as a pixel portion, after obtaining the state shown in FIG. 7C, a device electrically connected to a TFT is formed.) On the other hand, in case that the device formation layer 604 serves as an integrated circuit (controller, CPU, memory), the device formation layer 604 can be formed by a transfer technique explained in this embodiment. That is, a flexible auxiliary substrate which is provided with wirings in advance may be used and pasted onto a rear surface of a substrate on which a pixel portion and a driver circuit are formed.

Thus, embodiments 1 to 4 can be implemented by using a transfer technique explained in this embodiment.

Embodiment 6

Hereinafter, a method for fabricating simultaneously an n-channel TFT and a p-channel TFT over one substrate will be described in detail with reference to FIGS. 8A to 8D and 9A to 9D.

A quartz substrate, a semiconductor substrate, a ceramic substrate, a metal substrate, or the like, may be used as a substrate 800. In this embodiment, a glass substrate (#1737) is used for the substrate 800.

Next, a silicon oxynitride film formed by a material gas of $SiH_4$ and $N_2O$ (composition ratio of Si, O, N, H is 32:59:7:2) is stacked over the substrate 800 as a base insulating film 804 to have a thickness of 100 nm at deposition temperature of 300° C. by plasma chemical vapor deposition (hereinafter, plasma CVD). Further, a semiconductor layer having an amorphous structure (here, an amorphous silicon layer) is formed to have a thickness of 54 nm without exposure to the atmosphere using $SiH_4$ as deposition gas and at deposition temperature of 300° C. by plasma CVD. This amorphous silicon film contains hydrogen, the hydrogen will be diffused by heat treatment in later processes, and the amorphous silicon film can be peeled by splitting the oxide layer or peeling the interface between the oxide layer and another layer by a physical means.

Then, nickel acetate solution containing nickel of 10 ppm in weight is coated using a spinner. Instead of the coating, a method for spraying nickel elements to the entire surface by sputtering may also be used. Then, heat treatment is carried out to crystallize the resulted film to fabricate a semiconductor film having a crystalline structure (a polysilicon layer is formed in this instance). Here, after carrying out the heat treatment (500° C. for 1 hour) for dehydrogenation, heat treatment (550° C. for 4 hours) for crystallization is carried out, and a silicon film having a crystalline structure is formed. Also, the heat treatment (500° C. for 1 hour) for dehydrogenation doubles as heat treatment for diffusing the hydrogen contained in the amorphous silicon film into an interface between a tungsten film and a silicon oxide layer. Further, although a crystallization technique using nickel as a metal element that promotes crystallization of silicon is used here, another known crystallization technique such as a solid-phase growth method or a laser crystallization method may be used.

Next, after an oxide film formed over a surface of the silicon film having a crystalline structure is removed by dilute hydrofluoric acid or the like, laser light (XeCl: wavelength of 308 nm) is radiated in the atmosphere or in the presence of oxygen to raise a crystallization rate and to repair defects remaining in crystal grains. Excimer laser light with a wavelength of at most 400 nm, or second harmonic wave or third harmonic wave of a YAG laser is used as the laser light. In this case, pulse laser light with a repetition frequency of approximately from 10 to 1000 Hz is used, the pulse laser light is condensed to from 100 to 500 $mJ/cm^2$ by an optical system, and irradiation is performed with an overlap ratio of from 90 to 95%, whereby the silicon film surface may be scanned. Here, laser light is radiated in the atmosphere with a repetition frequency of 30 Hz and energy density of 470 $mJ/cm^2$.

Note that an oxide film is formed over a surface since laser light is radiated in the atmosphere or in the presence of oxygen. Though an example of using a pulse laser is shown here, the continuous oscillation laser may also be used. When a crystallization of an amorphous semiconductor film is carried out, it is preferable that the second harmonic through the fourth harmonic of basic waves are applied by using a solid state laser which is capable of continuous oscillation in order to obtain crystal in large grain size. Typically, it is preferable that the second harmonic (with a thickness of 532 nm) or the third harmonic (with a thickness of 355 nm) of an Nd: $YVO_4$ laser (basic wave of 1064 nm) may be applied. Specifically, laser light emitted from the continuous oscillation type $YVO_4$ laser with 10 W output is converted into a harmonic by using the non-linear optical elements. Also, a method for emitting a harmonic by applying crystal of $YVO_4$ and the non-linear optical elements into a resonator can be applied. Then, more preferably, the laser light is formed to have a rectangular shape or an elliptical shape by an optical system and a substance is exposed to the laser light. At this time, the energy density of approximately from 0.01 to 100 $MW/cm^2$ (preferably, from 0.1 to 10 $MW/cm^2$) is required. The semiconductor film is relatively moved at approximately from 10 to 2000 cm/s rate corresponding to the laser light so as to be exposed to the laser light.

In addition to the oxide film formed by the above described laser irradiation, a barrier layer is formed by the oxide film by treating the surface of the oxide film with ozone water for 120 seconds to have a thickness of from 1 to 5 nm in total. Though the barrier layer is formed by using ozone water here, another method such as ultraviolet light irradiation in the presence of oxygen or oxygen plasma treatment for oxidizing the surface of a semiconductor film having a crystalline structure may be used. In addition, as another method for forming the barrier layer, an oxide film having a thickness of approximately from 1 to 10 nm may be deposited by plasma CVD, sputtering, vapor deposition, or the like. Further, prior to fabricating the barrier layer, the oxide film formed by laser light irradiation may be removed.

Over the barrier layer, an amorphous silicon film containing argon elements, which serves as a gettering site, is formed by sputtering to have a thickness of from 10 to 400 nm, here, 100 nm. In this embodiment, an amorphous silicon film containing argon is formed under the atmosphere containing argon with using a silicon target. In case of forming an amorphous silicon film containing argon elements by plasma CVD, it is formed under the condition, that is, a flow ratio of monosilane to argon is controlled to be 1:99; a pressure during deposition to be 6.665 Pa (0.05 Torr); a RF power density during deposition to be 0.087 $W/cm^2$; and a deposition temperature to be 350° C.

Then, heat treatment for gettering is carried out in a furnace heated at 650° C. for 3 minutes to reduce the nickel concentration in the semiconductor film having a crystalline structure. A lamp annealing apparatus may be used instead of the furnace.

Subsequently, the amorphous silicon film containing argon elements, which serves as a gettering site, is selectively removed using the barrier layer as an etching stopper, and then, the barrier layer is selectively removed by dilute hydrofluoric acid. In addition, there is a tendency that nickel moves toward a region with high oxygen concentration in gettering, thus, it is desirable that the barrier layer formed by an oxide film is removed after gettering.

Figure 8A:
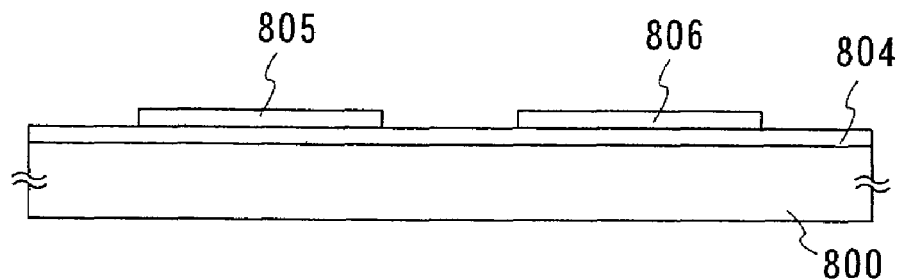
FIGS. 8A to 8D are explanatory views of a process for manufacturing a TFT.

Then, after a thin oxide film is formed by using ozone water over the surface of the obtained silicon film having a crystalline structure (also referred to as a polysilicon film), and a mask formed by resist is formed, then island-like semiconductor layers 805 and 806 isolated from each other in island shapes are formed by etching to have desired shapes. After forming the semiconductor layers 805 and 806, the mask formed by resist is removed (FIG. 8A).

Figure 8B:
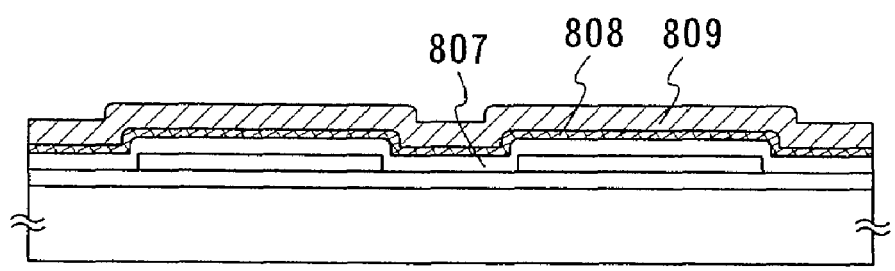

Then, the oxide film is removed with an etchant containing hydrofluoric acid, and at the same time, the surface of the silicon film is washed. Thereafter, an insulating film containing silicon as its main components, which serves as a gate insulating film 807, is formed. In this embodiment, a silicon oxynitride film is formed with a thickness of 115 nm by plasma CVD (FIG. 8B).

Next, a first conductive film 808 with a thickness of from 20 to 100 nm and a second conductive film 809 with a thickness of from 100 to 400 nm are stacked over the gate insulating film 807. In this embodiment, a tantalum nitride film with a thickness of 50 nm and a tungsten film with a thickness of 370 nm are sequentially stacked over the gate insulating film 807.

As a conductive material for fabricating the first conductive film 808 and the second conductive film 809, an element selected from the group consisting of Ta, W, Ti, Mo, Al and Cu, or an alloy material or a compound material containing the above elements as its main components is used. Further, as a first conductive film 808 and a second conductive film 809, a semiconductor film as typified by a polycrystalline silicon film added with an impurity element such as phosphorus, or an Ag—Pd—Cu alloy may be used. Further, the present invention is not limited to a two-layer structure. For example, a three-layer structure may be adopted in which a tungsten film having a thickness of 50 nm, an alloy film of aluminum and silicon (Al—Si) having a thickness of 500 nm, and a titanium nitride film having a thickness of 30 nm are sequentially stacked. Moreover, in case of a three-layer structure, tungsten nitride may be used instead of tungsten of the first conductive film, an alloy film of aluminum and titanium (Al—Ti) may be used instead of the alloy film of aluminum and silicon (Al—Si) of the second conductive film, and a titanium film may be used instead of the titanium nitride film of the third conductive film. In addition, a single layer structure may also be adopted.

Figure 8C:
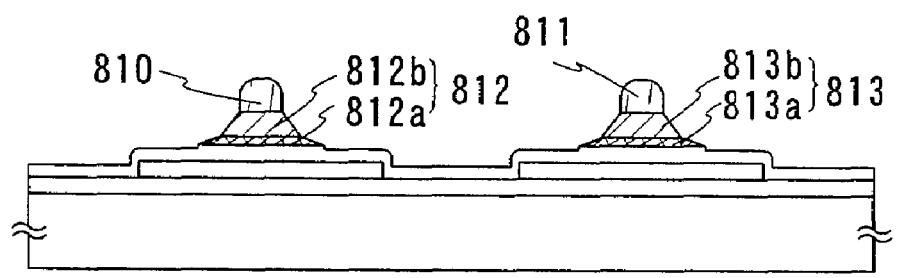

Next, resist masks 810, 811 are formed in a light exposure process as shown in FIG. 8C. Then, a first etching treatment is carried out for forming gate electrodes and wirings. The first etching treatment is carried out under first and second etching condition. ICP (inductively coupled plasma) etching is preferably used. The films can be etched to have desired taper shapes by using ICP etching and suitably adjusting the etching condition such as the amount of power applied to a coiled electrode, the amount of power applied to an electrode on the substrate side, the temperature of the electrode on the substrate side, etc. As etching gas, chlorine-based gas as typified by $Cl_2$, $BCl_3$, $SiCl_4$, or $CCl_4$, fluorine-based gas as typified by $CF_4$, $SF_6$, or $NF_3$, or $O_2$ can be appropriately used.

In this embodiment, RF (13.56 MHz) power of 150 W is applied also to the substrate (sample stage) to substantially apply a negative self-bias voltage. The electrode area to the substrate side is 12.5 cm×12.5 cm, and the coil-shape electrode area (quartz disc provided with coil is described here) is 25 cm diameter disc. The tungsten film (W film) is etched so as to form an edge portion of the first conductive layer in a taper shape under the first etching condition. An etching rate to tungsten is 200.39 nm/min, an etching rate to TaN is 80.32 nm/min, and the selection ratio of W to TaN is approximately 2.5 under the first etching condition. Further, a taper angle of W becomes approximately 26° under the first etching condition. Thereafter, the first etching condition is changed to the second etching condition without removing the masks 810, 811 formed by resist. $CF_4$ and $Cl_2$ is used as etching gases, the flow rate of the gas is set to 30/30 sccm, and RF (13.56 MHz) power of 500 W is applied to a coil-shape electrode with a pressure of 1 Pa to generate plasma, thereby performing etching for about 30 seconds. RF (13.56 MHz) power of 20 W is also applied to a substrate side (sample stage) to substantially apply a negative self-bias voltage. Both the W film and the TaN film are etched at the same level under the second etching condition in which $CF_4$ and $Cl_2$ are mixed. An etching rate to W is 58.97 nm/min, and an etching rate to TaN is 66.43 nm/min under the second etching condition. Note that time to etch may be increased approximately to from 10 to 20% in order to etch without leaving residue over the gate insulating film.

In the first etching treatment as described above, the shape of the mask formed by resist is formed into an appropriate shape whereby each an edge portion of the first conductive layer and the second conductive layer is formed to have a tapered shape due to the effect of bias voltage applied to the substrate side. The angle of the tapered portion may be set to from 15 to 45°.

Thus, first shape conductive layers 812 and 813 composed of the first conductive layer and the second conductive layer (first conductive layers 812a and 813a and second conductive layers 812b and 813b) are formed by the first etching treatment. According to this, the insulating film 807 that is not covered by the first shape conductive layers 812 and 813 is etched by approximately from 10 to 20 nm to be thin and formed into a gate insulating film 811.

Figure 8D:
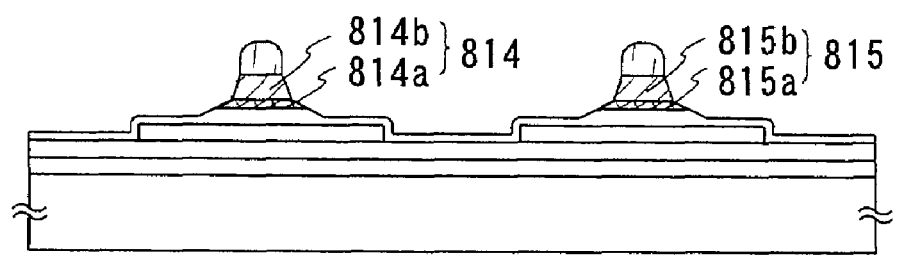

Next, as shown in FIG. 8D, a second etching treatment is carried out for 25 seconds without removing the masks formed by resist under the condition, that is, $SF_6$, $Cl_2$ and $O_2$ are used as etching gas; the flow rate of the gas is set to be 24/12/24 sccm; and RF (13.56 MHz) power of 700 W is applied to a coil-shape electrode with pressure of 1.3 Pa to generate plasma. RF (13.56 MHz) power of 10 W is also applied to the substrate side (sample stage) to substantially apply a negative self-bias voltage. In the second etching treatment, an etching rate to W is 227.3 nm/min, an etching rate to TaN is 32.1 nm/min, a selection ratio of W to TaN is 7.1, an etching rate to SiON, which serves as the insulating film 1211, is 33.7 nm/min, and a selection ration of W to SiON is 6.83. In case where $SF_6$ is used as etching gas, the selection ratio with respect to the insulating film 811 is high as described above. Thus, reduction in the film thickness can be suppressed. In this embodiment, the film thickness of the insulating film 811 is reduced by only approximately 8 nm.

Through the second etching treatment, the taper angle of W can be set to 70°. Through the second etching treatment, second conductive layers 814b and 815b are formed. On the other hand, the first conductive layers are hardly etched and formed into first conductive layers 814a, 815a. In addition, the first conductive layers 814a, 815a have substantially the same size as that of the first conductive layers 812a, 813a. In actuality, the width of the first conductive layer may be reduced by approximately 0.3 µm, namely, approximately 0.6 µm in total, in comparison with the first conductive layer prior to being applied with the second etching treatment. There is almost no change in size of the first conductive layer.

Further, instead of a two-layer structure, in case that a three-layer structure is adopted in which a tungsten film with a thickness of 50 nm, an alloy film of aluminum and silicon (Al—Si) with a thickness of 500 nm, and a titanium nitride film with a thickness of 30 nm are sequentially stacked, the first etching treatment may be carried out for 117 seconds under the condition, that is, $BCl_3$, $Cl_2$ and $O_2$ are used as raw material gases; the flow rate of the gases are set to 65/10/5 (sccm); RF (13.56 MHz) power of 300 W is applied to a substrate side (sample stage); and RF (13.56 MHz) power of 450 W is applied to a coil-shape electrode with a pressure of 1.2 Pa to generate plasma. As to the second etching condition in the first etching treatment, that is, $CF_4$, $Cl_2$ and $O_2$ are used; the flow rage of the gases is set to 25/25/10 sccm; RF (13.56 MHz) power of 20 W is also applied to the substrate side (sample stage); and RF (13.56 MHz) power of 500 W is applied to a coil-shape electrode with a pressure of 1 Pa to generate plasma. The first etching treatment may be carried out for approximately 30 seconds under the second etching condition. The second etching treatment may be carried out under the condition, that is, $BCl_3$ and $Cl_2$ are used; the flow rate of the gases are set to 20/60 sccm; RF (13.56 MHz) power of 100 W is applied to a substrate side (sample stage); and RF (13.56 MHz) power of 600 W is applied to a coil-shape electrode with a pressure of 1.2 Pa to generate plasma.

Figure 9A:
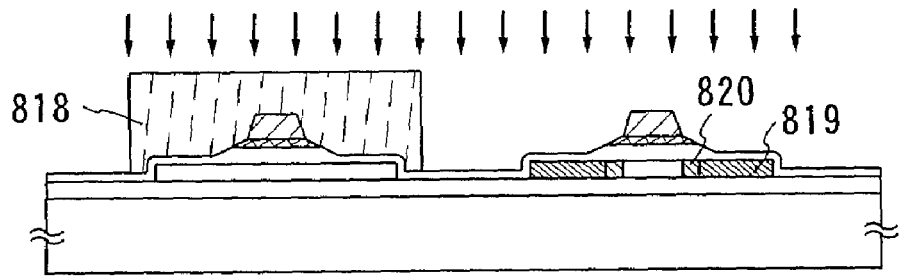
FIGS. 9A to 9D are explanatory views of a process for manufacturing a TFT.

Next, a mask 810 formed by resist is removed, and mask 818 formed by resist is formed, then, a first doping process is carried out as shown in FIG. 9A. The doping process may be carried out by ion doping or ion implantation. In addition, the mask 818 protects a semiconductor film for forming a p-channel type TFT and a periphery region thereof.

Ion doping is carried out under the condition of dose amount of $1.5 \times 10^{15}$ atoms/cm² and an accelerating voltage of from 60 to 100 keV. As an impurity element imparting n-type conductivity, phosphorous (P) or arsenic (As) is typically used. In such a case, second conductive layers 814b, 815b serve as masks, and first impurity regions are formed in a self-aligning manner in each semiconductor layer. Needless to say, a region covered with the mask is not added with impurity elements. Thus, a first impurity region 819 and a second impurity region 820 are formed. The impurity element imparting n-type conductivity is added to the first impurity region 819 in a concentration range of from $1 \times 10^{20}$ to $1 \times 10^{21}$/cm³. Here, a region having the same concentration range as that of the first impurity region is referred to as an n⁺ region.

Further, the second impurity region 820 is formed to have a lower concentration than that in the first impurity region 819 by influence of the first conductive layer 815a, and is added with the impurity elements imparting n-type conductivity in a concentration range of from $1 \times 10^{18}$ to $1 \times 10^{19}$/cm³. Note that the second impurity region 820 is doped through the tapered portion of the first conductive layer 815a so that the second impurity region 820 produces the concentration gradient in which the impurity concentration becomes higher toward the edge portion of the tapered portion. Here, the region having the same concentration range as that of the second impurity region 820 is referred to as an n⁻ region.

Figure 9B:
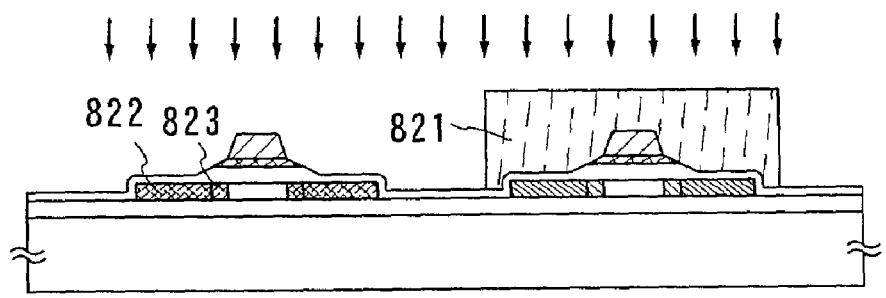

Next, after the mask 818 formed by resist is removed, mask 821 formed by resist is newly formed, and a second doping process is carried out as shown in FIG. 9B.

The above-described third doping process is carried out, and a third impurity region 822 and a fourth impurity region 823 are formed in which impurity elements imparting p-type conductivity are added to the semiconductor layer.

Further, the impurity element imparting p-type conductivity is added to the third impurity region 822 in a concentration range of from $1 \times 10^{20}$ to $1 \times 10^{21}$/cm³. Note that, in the third impurity region 822, phosphorous (P) has been added in the preceding step (n⁻ region), but the impurity element imparting p-type conductivity is added at 1.5 to 3 times as the concentration of phosphorous. Thus, the third impurity region 822 has p-type conductivity. Here, the region having the same concentration range as the third impurity region 822 is also referred to as a p⁺ region.

Further, fourth impurity region 823 is formed in regions overlapping the tapered portion of the first conductive layer 815a, and is added with the impurity element imparting p-type conductivity in a concentration range of from $1 \times 10^{18}$ to $1 \times 10^{20}$/cm³. Here, the region having the same concentration range as the fourth impurity region 823 is also referred to as a p⁻ region.

Through the above-described process, impurity regions having n-type or p-type conductivity are formed in each semiconductor layer. The conductive layers 814, 815 become gate electrodes of a TFT.

Then, the process of activation treatment for the impurity element added to each of the semiconductor layers is carried out. In this activation process, a rapid thermal annealing (RTA) method using a lamp light source, a method for radiating light emitted from a YAG laser or an excimer laser from the back surface, heat treatment using a furnace, or a combination thereof is employed.

A first insulating film 824 is formed. In this embodiment, a silicon nitride oxide film with a thickness of 50 nm formed by plasma CVD is used for forming the insulating film 824. Of course, the insulating film is not limited to the silicon nitride oxide film, an insulating film such as a silicon nitride film, a silicon oxynitride film, or a silicon oxide film can be used for the insulating film 824 in a single layer or a lamination layer.

A second insulating film 825 is formed over the first insulating film 824. An insulating film such as a silicon nitride film, a silicon nitride oxide film, or a silicon oxide film can be used for the second insulating film 825. In this embodiment, a silicon nitride film with a thickness of 50 nm formed by plasma CVD can be used for the second insulating film 825.

Figure 9C:
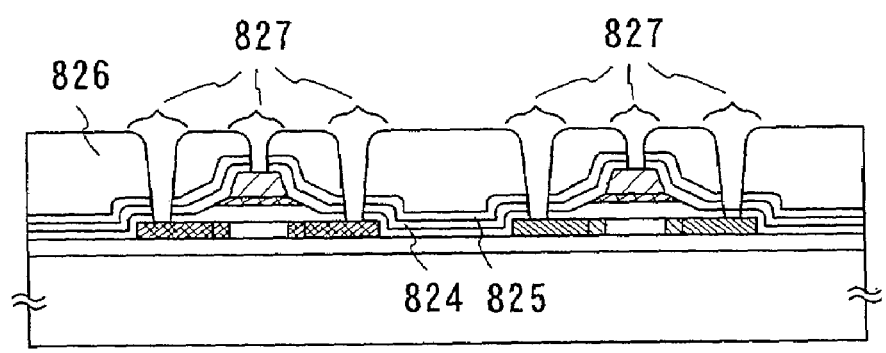

Next, the second insulating film 825 is formed by a silicon nitride film, and heat-treated at the temperature of from 300 to 550° C. for 1 to 12 hours, then, the process of hydrogenation for the semiconductor layers is carried out (FIG. 9C). The hydrogenation is carried out for terminating dangling bonds of the semiconductor layers by hydrogen contained in the second insulating film 825. As another means for hydrogenation, heat treatment at 350° C. in the presence of hydrogen or plasma hydrogenation (using hydrogen excited by plasma) may be adopted.

Next, a third insulating film 826 is formed by an organic insulating over the second insulating film 825. In this embodiment, an acrylic resin film with a thickness of 1.6 µm is formed. Then, contact holes 827 that reach the respective impurity regions are formed.

Since photosensitive acryl is used for the acrylic resin film, contact holes in desired positions can be picked by exposing and developing the acrylic resin film. The first insulating film 824 is used as an etching stopper to etch partly the second insulating film 825 by dry etching, then, the first insulating film 825 is partly etched by dry etching. Subsequently, the contact holes 827 are obtained.

In this embodiment, the case that the contact holes are formed after forming the third insulating film 826 by an organic resin film is explained, however, the first insulating film and the second insulating film can be dry etched before forming the third insulating film 826. In this instance the substrate is preferably heat-treated at the temperature of from 300 to 550° C. for 1 to 12 hours after etching treatment and before forming the third insulating film 826.

Figure 9D:
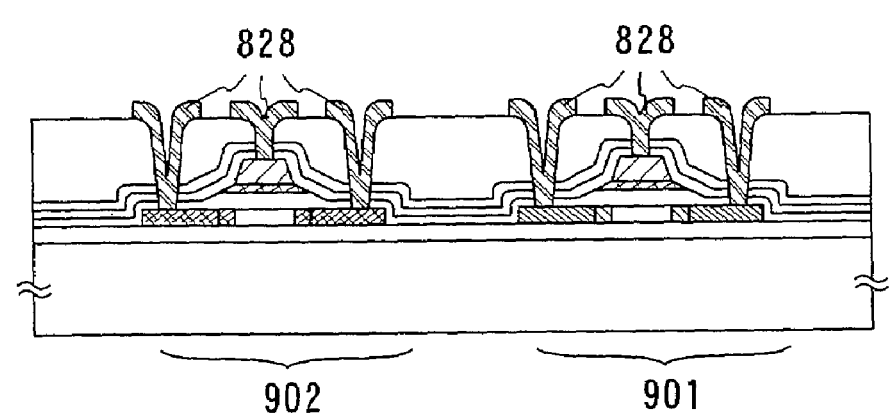

Then, wiring 828 is formed by using Al, Ti, Mo, W, or the like, as shown in FIG. 9D, consequently, an n-channel TFT 901 and a p-channel TFT 902 can be formed over the same substrate.

Embodiment 7

In embodiment 7, a process for mass-producing semiconductor device by a transfer technique according to the present invention with reference to FIGS. 10A and 10B.

FIG. 10A is a view showing a process for forming a device formation layer which will be transferred to a large flexible substrate. FIG. 10B is a view showing a process for applying a large flexible substrate.

Detail explanation of materials or treatment conditions in a process for forming a device formation layer shown in FIG. 10A is omitted, since the process is the same as that explained in embodiment 5.

A device formation layer 930 including a TFT 932 is formed over a first substrate 931 by a process a, and an organic resin layer 933 is formed over the TFT 932 by a process b. Then, a second substrate 935 is pasted onto the organic resin layer 933 via an adhesive layer 934 by a process c, and then, the first substrate 931 is separated by a process d. In case that the state obtained by the process d has a plurality of circuits, the circuits are divided into each circuit by a process e.

As shown in FIG. 10B, a roller 901 is wrapped around a flexible substrate 900, and is moved in the right direction in the view by a feed roller 911 to carry out treatment.

An adhesive film 902 is pasted onto the flexible substrate 900 by pressure rollers (903, 904) by the first process. After the adhesive film 902 is formed, the device formation layer formed by the process e shown in FIG. 10A is pasted onto the adhesive film 902 by the second process.

In the third process, the flexible substrate pasted with the device formation layer is irradiated with UV light in a UV irradiation chamber 905 to weaken adhesive force of the adhesive layer 934. Then, a second substrate 935 is separated by a separating means 906, and the top surface of the substrate 900 is washed in a washing chamber 907 to remove the organic resin layer 933.

Further, a protective layer is formed by the fourth process. Here, an organic material such as UV cure resin is coated by a coating means 908. Thereafter, the resulted film is irradiated with UV light in the UV irradiation chamber 909 to cure the organic material. Subsequently, a protective film can be formed.

Lastly, the transferred device formation layers are divided into each layer by a cutter 910 by the fifth process.

Accordingly, throughput can be improved and costs for manufacturing can be reduced since continuous treatment and mass production can be realized by transferring a plurality of device formation layers to a large flexible substrate.

Embodiment 8

Figure 11:
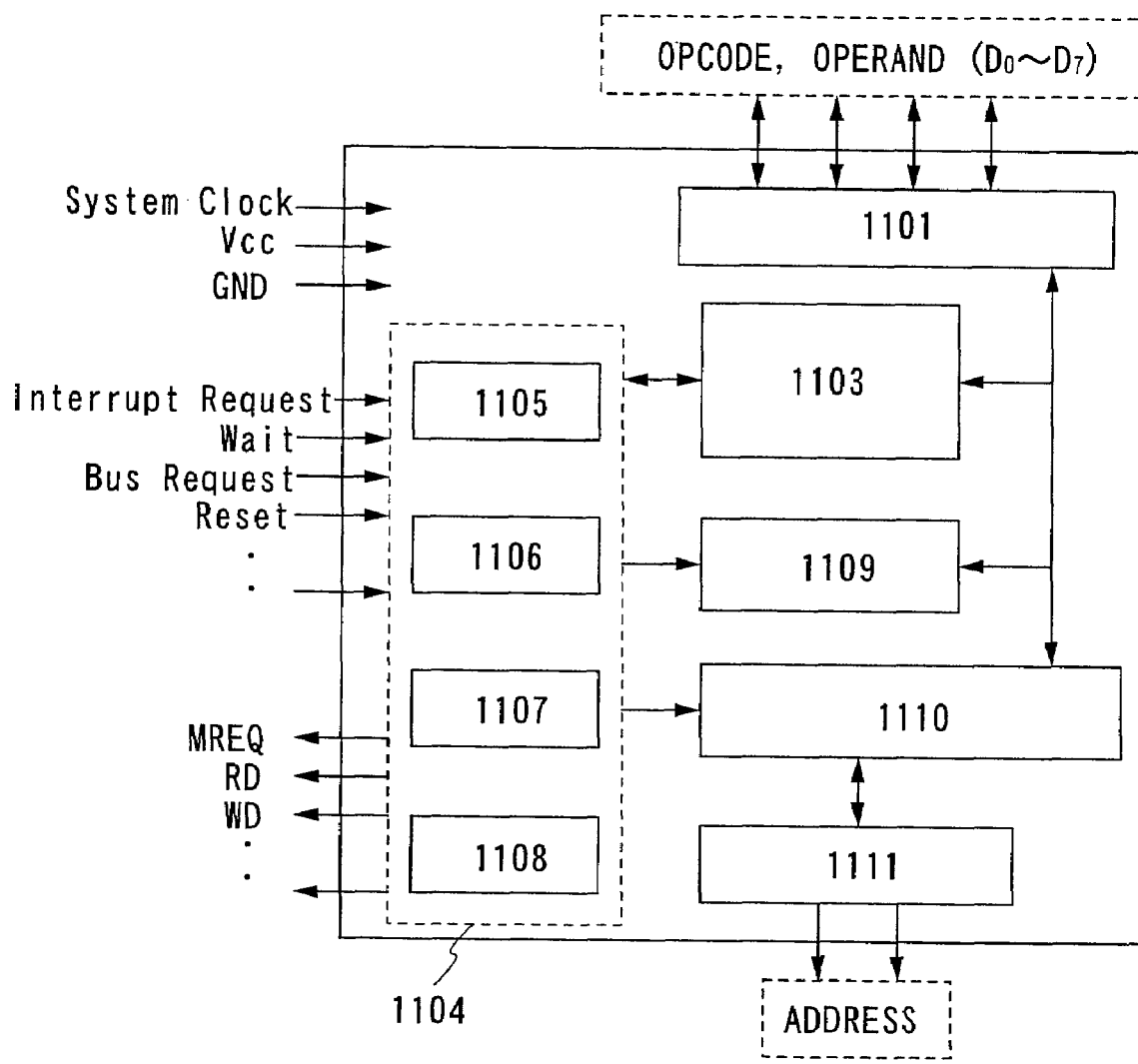
FIG. 11 is an explanatory view of a configuration of a CPU.

Functions and a configuration of a CPU in case that the CPU is manufactured by a transfer technique will be explained in this embodiment with reference to FIG. 11.

Upon inputting an opcode to a data bus interface 1101, the code is decoded by an analysis circuit 1103 (also referred to as Instruction Decoder), and a signal is inputted to a control signal generation circuit 1104 (CPU Timing Control). Upon inputting the signal to the control signal generation circuit 1104, a control signal is outputted from the control signal generation circuit 1104 to an arithmetic circuit 1109 (hereinafter, ALU) and to a storage circuit 1110 (hereinafter, Register).

The control signal generation circuit 1104 comprises an ALU controller 1105 for controlling the ALU 1109 (hereinafter, ACON), a circuit 1106 for controlling the Register 1110 (hereinafter, RCON), a timing controller 1107 for controlling timing (hereinafter, TCON), and an interruption controller for controlling interruption (hereinafter, ICON).

Upon inputting an operand to the data bus interface 1101, the operand is outputted to the ALU 1109 and the Register 1110. Then, a process based on a control signal inputted from the control signal generation circuit 1104, for example, memory read cycle, memory write cycle, I/O read cycle, I/O write cycle, or the like, is carried out.

In addition, the Register 1110 is composed of a general register, a stack pointer (SP), a program counter (PC), and the like.

Further, an address controller 1111 (hereinafter, ADRC) outputs 16 bits address.

The configuration of the CPU described in this embodiment is one example of a CPU included in a semiconductor chip according to the present invention, and does not limit the configuration according to the invention. Therefore a semiconductor chip according to the invention can be completed by using a known CPU having other than configuration which is described in this embodiment.

Figure 12:
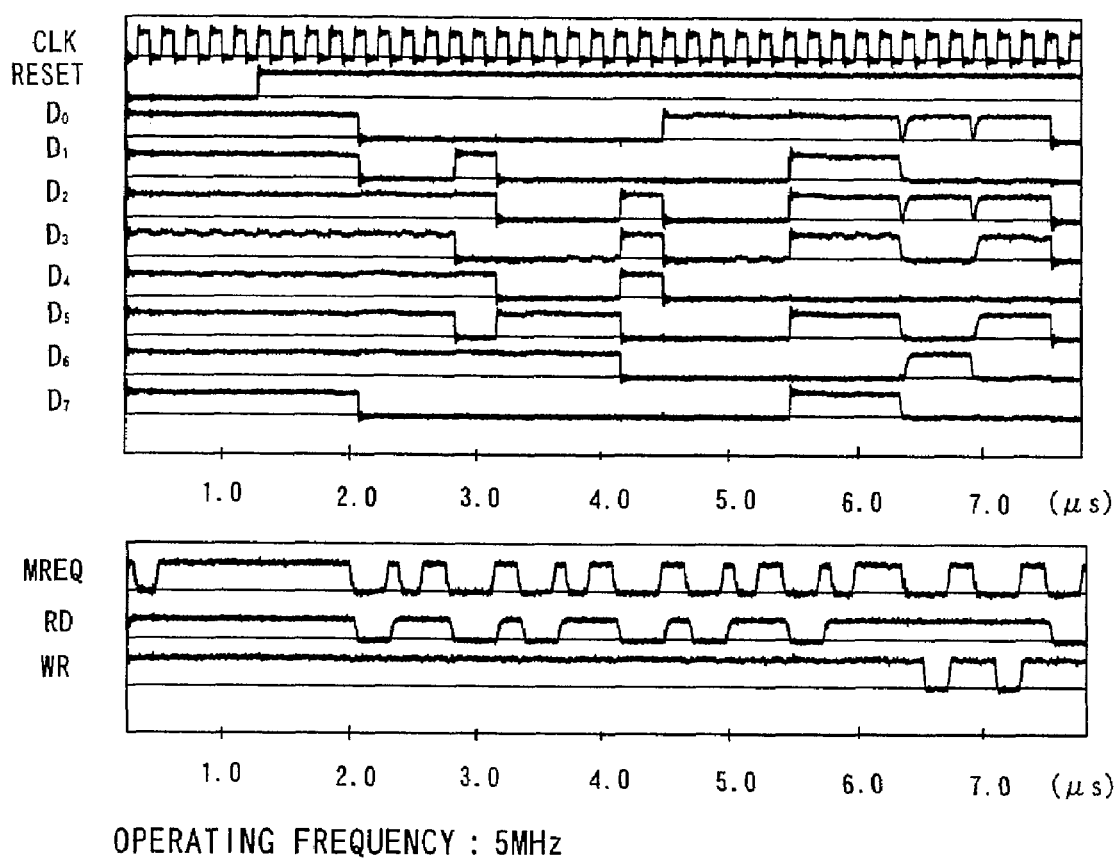
FIG. 12 is a timing chart of an operation of a CPU having the configuration described with reference to FIG. 11.

FIG. 12 is a timing chart of an operation of a CPU having the configuration described with reference to FIG. 11. CLK (clock signal) is an input signal for a CPU which is shown in FIG. 12. The CLK is an input signal as System Clock as shown in FIG. 11. In addition, RESET (reset signal) for inputting to the control signal generation circuit 1104 and a signal (from $D_0$ to $D_7$) (opcodes or operands) for inputting to the data bus interface 1101 are respectively inputted to the CPU. Further, MREQ (memory request), RD (read signal), and WD (write signal) are respectively outputted from the CPU as output signals. In this case, the operating frequency shall be 5 MHz.

Figure 13A:
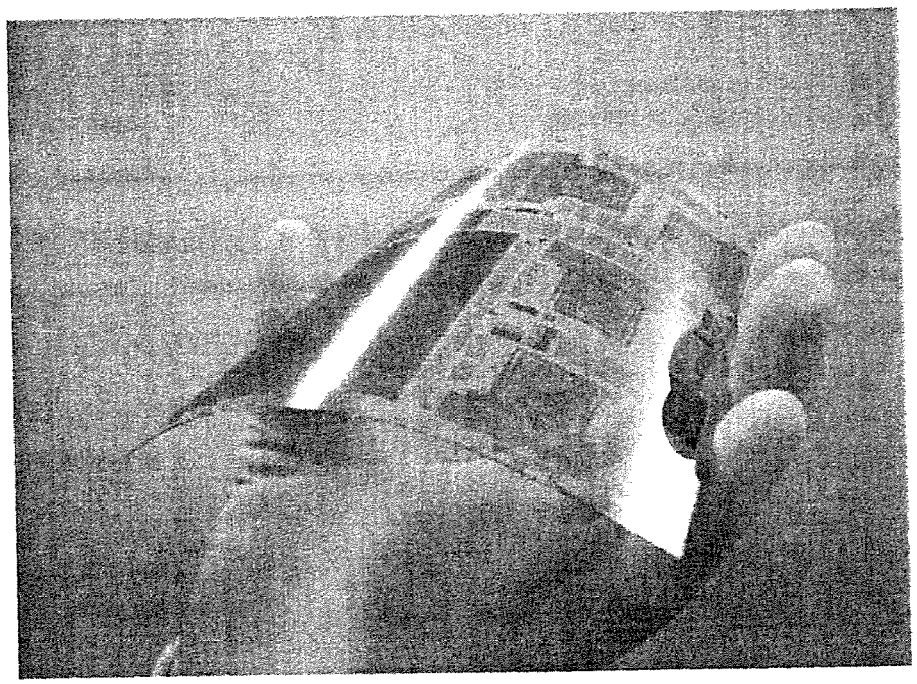
FIGS. 13A and 13B are photograph of a CPU according to the invention.
Figure 13B:
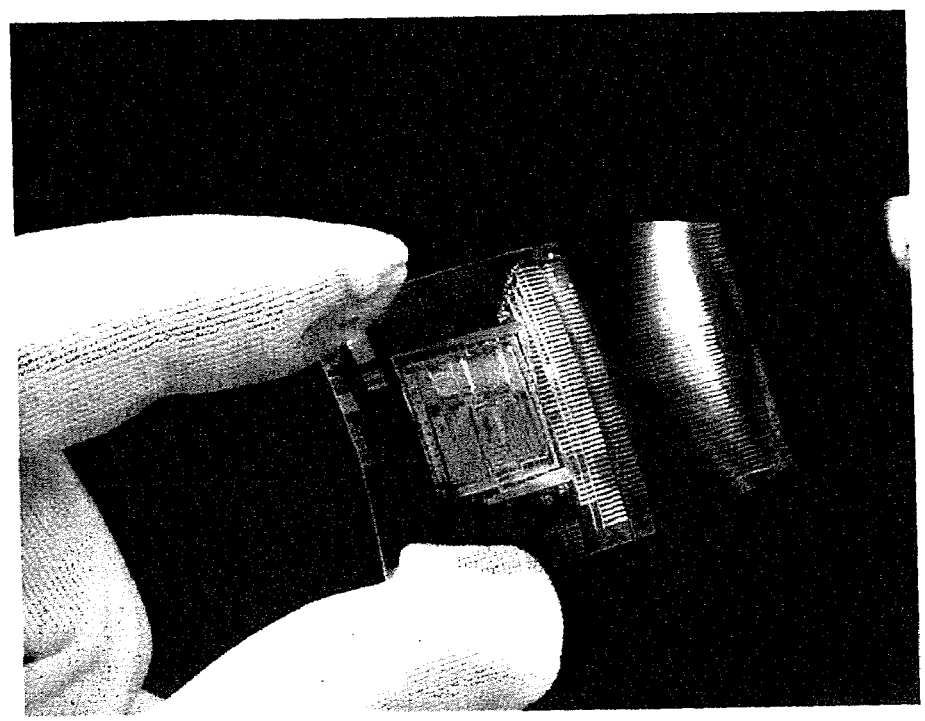

FIGS. 13A, 13B, 14A, and 14B are photographs of the CPU explained in this embodiment. FIG. 13A is a photograph showing a state that a plurality of CPU is formed over one substrate. The CPU shown in the FIG. 13A can be formed by a method explained in embodiment 5. A bending mode as shown in FIG. 13A is available since the fourth substrate 617 shown in FIGS. 7A to 7C is formed by a flexible substrate. FIG. 13B is a state that each piece of CPU divided from a plurality of CPUs, which are formed over one substrate, is connected to an FPC.

Figure 14A:
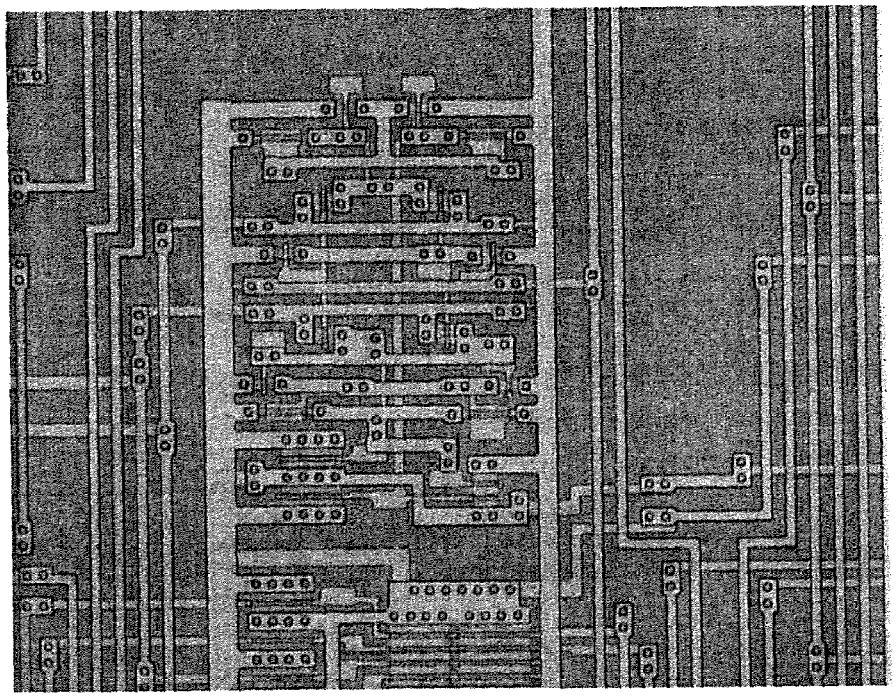
FIGS. 14A and 14B are photograph of a CPU according to the invention.
Figure 14B:
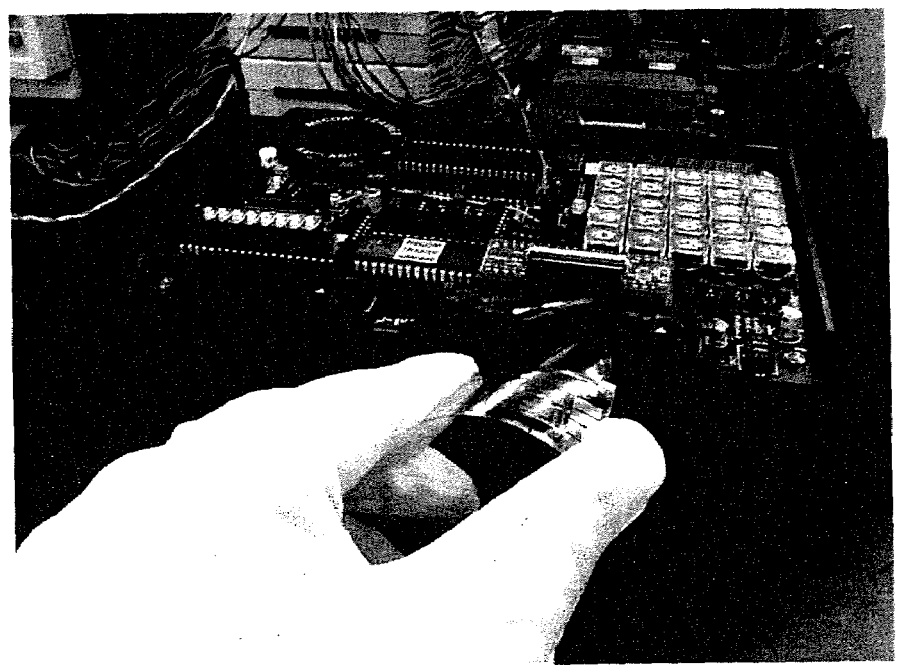

FIG. 14A is a photograph of a part of a CPU. FIG. 14B is a photograph showing the state that a CPU according to the invention is installed in a part of sound equipment. Therefore a CPU according to the invention can be driven in a similar manner as the conventional CPU.

Embodiment 9

According to this embodiment, various electronic equipments can be completed by installing integrated circuits, which are formed by a transfer technique, into various portions of each module of the various electronic equipments.

Given as some examples of electronic equipments are: a video camera, a digital camera, a head mounting display (a goggle type display), a car navigation, a projector, a car stereo component, a personal computer, a portable information terminal such as a mobile computer, a cellular phone, a mobile game machine, or an electronic notebook, a device that can reproduce recording medium and that can display images of these recording mediums, and the like. FIGS. 15A to 15G show specific examples of the electronic equipments.

Figure 15A:
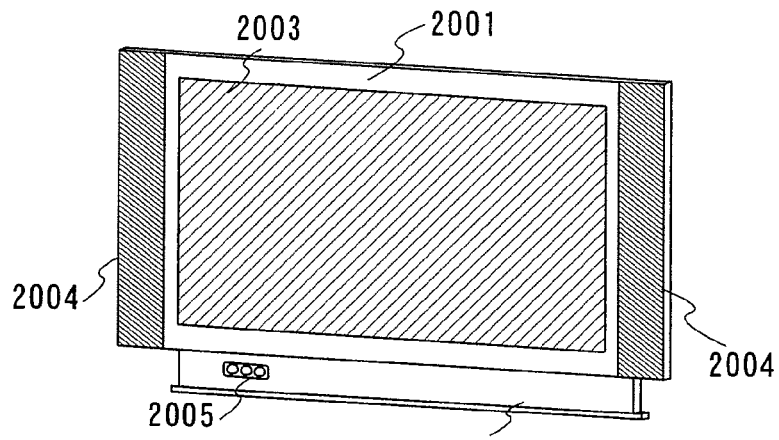
FIGS. 15A to 15G are explanatory views of electronic equipments.

FIG. 15A shows a display including a frame 2001, a support 2002, a display screen unit 2003, a speaker 2004, a video input terminal 2005, and the like. A module of the display screen unit 2003 includes an integrated circuit formed by a transfer technique. The display includes all information display apparatus such as an apparatus for a personal computer, a TV broadcasting, an advertisement, or the like.

Figure 15B:
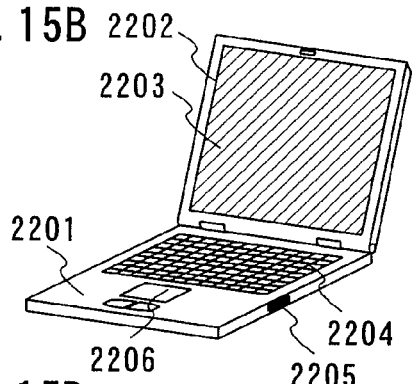

FIG. 15B shows a laptop computer including a main body 2201, a frame 2202, a display screen unit 2203, a keyboard 2204, an external connection port 2205, a pointing mouse 2206, and the like. A module of the display screen unit 2203 includes an integrated circuit formed by a transfer technique.

Figure 15C:
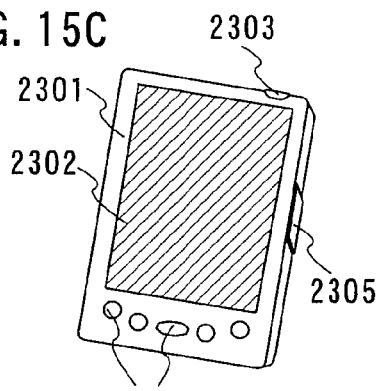

FIG. 15C shows a mobile computer including a main body 2301, a display screen unit 2302, a switch 2303, an operation key 2304, an infrared port 2305, and the like. A module of the display screen unit 2302 includes an integrated circuit formed by a transfer technique.

Figure 15D:
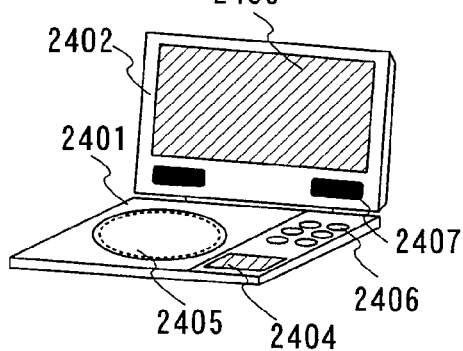

FIG. 15D shows a player using a record medium recorded with programs (hereinafter, a record medium) including a main body 2401, a frame 2402, a display screen unit A 2403, a display screen unit B 2404, a recording medium reading portion 2405, an operation key 2406, a speaker portion 2407, and the like. The player uses DVD (Digital Versatile Disc), CD or the like as a record medium and can enjoy music, enjoy movie and carry out game or Internet.

Figure 15E:
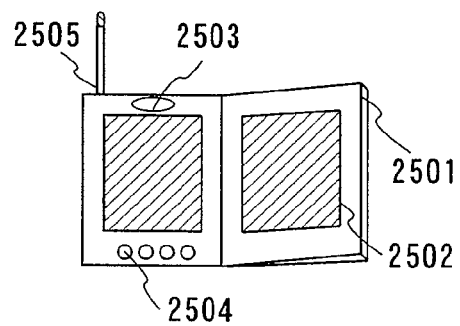

FIG. 15E shows a portable book (electronic book) including a main body 2501, display screen unit 2502, a record medium 2503, an operation key 2504, an antenna 2505, and the like. A module of the display screen unit 2502 includes an integrated circuit formed by a transfer technique.

Figure 15F:
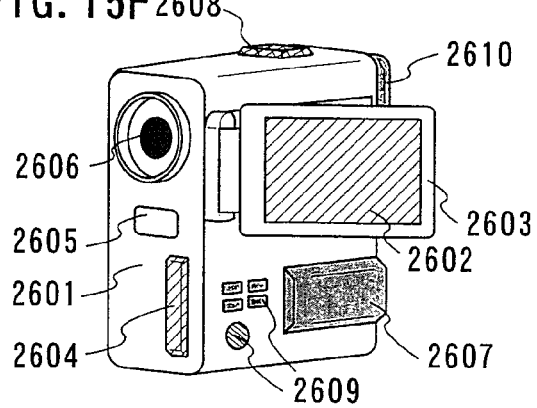

FIG. 15F shows a video camera including a main body 2601, a display screen unit 2602, a frame 2603, an external connection port 2604, a remote control receiving portion 2605, an image receiving portion 2606, a voice input portion 2608, operation keys 2609, an eye piece portion 2610, and the like. A module of the display screen unit 2602 includes an integrated circuit formed by a transfer technique.

Figure 15G:
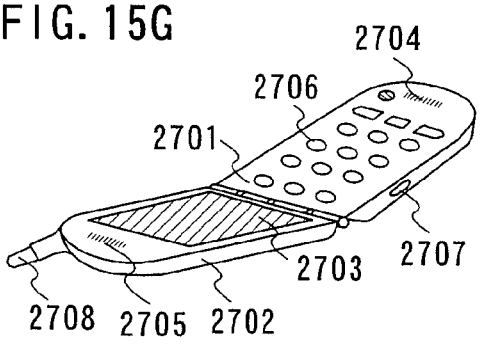

FIG. 15G shows a cellular phone including a main body 2701, a frame 2702, a display screen unit 2703, a sound input portion 2704, a sound output portion 2705, an operation key 2706, an external connection port 2707, an antenna 2708, and the like. A module of the display screen unit 2703 includes an integrated circuit formed by a transfer technique.

As has been described, the range of applying the module including an integrated circuit according to the present invention is extremely wide, and is applicable to electronic equipments of all the fields.

According to the invention, a thin film device becomes possible to be formed in the portion which was impossible to be provided with such device by the conventional technique. Therefore a semiconductor device which occupies small space and which has high shock resistance and flexibility can be provided.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A semiconductor device comprising:
    a panel comprising:
        a substrate having a front surface and a rear surface;
        a pixel portion formed over the front surface of the substrate; and
        a driver circuit formed over the front surface of the substrate,
    wherein an integrated circuit is formed on the rear surface of the substrate.

2. A semiconductor device according to claim 1, the integrated circuit includes at least one part selected from the group consisting of a controller, a CPU, and a memory.

3. A semiconductor device according to claim 1, the integrated circuit has a thickness of at most 50 μm.

4. A semiconductor device comprising:
    a panel comprising:
        a substrate having a front surface and a rear surface;
        a pixel portion formed over the front surface of the substrate; and
        a driver circuit formed over the front surface of the substrate,
    wherein an integrated circuit is formed by sticking a device formation layer including a plurality of thin film transistors to the rear surface of the substrate.

5. A semiconductor device according to claim 4, the integrated circuit includes at least one part selected from the group consisting of a controller, a CPU, and a memory.

6. A semiconductor device according to claim 4, the integrated circuit has a thickness of at most 50 μm.

7. A semiconductor device comprising:
    a panel comprising:
        a substrate having a front surface and a rear surface;
        a pixel portion formed over the front surface of the substrate;
        a driver circuit formed over the front surface of the substrate; and
        an auxiliary wiring,
    wherein an integrated circuit is formed by sticking a device formation layer including a plurality of thin film transistors to the rear surface of the substrate directly, and
    wherein the pixel portion and the driver circuit are electrically connected to the integrated circuit via the auxiliary wiring.

8. A semiconductor device according to claim 7, the integrated circuit includes at least one part selected from the group consisting of a controller, a CPU, and a memory.

9. A semiconductor device according to claim 7, the integrated circuit has a thickness of at most 50 μm.

* * * * *